(12) United States Patent
Yang et al.

(10) Patent No.: US 11,159,129 B2
(45) Date of Patent: *Oct. 26, 2021

(54) POWER AMPLIFIER TIME-DELAY INVARIANT PREDISTORTION METHODS AND APPARATUS

(71) Applicant: DALI WIRELESS, INC., Menlo Park, CA (US)

(72) Inventors: Dali Yang, Mountain View, CA (US); Jia Yang, Mountain View, CA (US)

(73) Assignee: DALI WIRELESS, INC., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/901,116

(22) Filed: Jun. 15, 2020

(65) Prior Publication Data

US 2020/0313631 A1 Oct. 1, 2020

Related U.S. Application Data

(63) Continuation of application No. 16/118,329, filed on Aug. 30, 2018, now Pat. No. 10,693,425, which is a (Continued)

(51) Int. Cl.
*H04B 1/04* (2006.01)
*H03F 1/32* (2006.01)
(Continued)

(52) U.S. Cl.
CPC ......... *H03F 1/3247* (2013.01); *H03F 1/3241* (2013.01); *H03F 3/24* (2013.01);
(Continued)

(58) Field of Classification Search
CPC ...... H03F 1/3241; H03F 1/3247; H03F 1/345; H03F 1/0222; H03F 2200/57;
(Continued)

(56) References Cited

U.S. PATENT DOCUMENTS 4,638,248 A  1/1987 Schweickert
4,700,151 A  10/1987 Nagata
(Continued)

FOREIGN PATENT DOCUMENTS

CN  1288341 A  3/2001
CN  1297608 A  5/2001
(Continued)

OTHER PUBLICATIONS

U.S. Appl. No. 13/886,190, filed May 2, 2013, Yang.
(Continued)

*Primary Examiner* — Tuan Pham (74) *Attorney, Agent, or Firm* — Artegis Law Group, LLP (57) ABSTRACT

An embodiment of the invention is a time-delay invariant predistortion approach to linearize power amplifiers in wireless RF transmitters. The predistortion architecture is based on the stored-compensation or memory-compensation principle by using a combined time-delay addressing method, and therefore, the architecture has an intrinsic, self-calibrating time-delay compensation function. The predistortion architecture only uses a lookup table to conduct both the correction of non-linear responses of a power amplifier and the compensation of any time-delay effects presented in the same system. Due to the time-delay invariant characteristic, the predistortion design has a wider dynamic range processing advantage for wireless RF signals, and therefore can be implemented in multi-carrier and multi-channel wireless systems.

16 Claims, 3 Drawing Sheets

Related U.S. Application Data continuation of application No. 14/788,567, filed on Jun. 30, 2015, now Pat. No. 10,097,142, which is a continuation of application No. 13/724,157, filed on Dec. 21, 2012, now Pat. No. 9,077,297, which is a continuation of application No. 12/021,241, filed on Jan. 28, 2008, now Pat. No. 8,380,143, which is a continuation-in-part of application No. 11/262,079, filed on Oct. 27, 2005, now Pat. No. 8,326,238, which is a continuation of application No. 10/137,556, filed on May 1, 2002, now Pat. No. 6,985,704.

(60) Provisional application No. 60/898,312, filed on Jan. 29, 2007, provisional application No. 60/897,746, filed on Jan. 26, 2007.

(51) Int. Cl.
 *H03F 3/24* (2006.01)
 *H04L 1/00* (2006.01)

(52) U.S. Cl.
 CPC ......... *H04B 1/0475* (2013.01); *H04L 1/0044* (2013.01); *H03F 2200/451* (2013.01); *H03F 2200/57* (2013.01); *H03F 2201/3224* (2013.01); *H03F 2201/3233* (2013.01); *H04B 2001/0425* (2013.01)

(58) Field of Classification Search
 CPC ................ H03F 1/0288; H03F 1/3217; H03F 2201/3224; H04B 1001/0425; H04B 1/62
 See application file for complete search history.

(56) References Cited

U.S. PATENT DOCUMENTS

| | | |
|---|---|---|
| 4,755,795 A | 7/1988 | Page |
| 4,890,300 A | 12/1989 | Andrews |
| 4,929,906 A | 5/1990 | Voyce et al. |
| 4,999,831 A | 3/1991 | Grace |
| 5,049,832 A | 9/1991 | Cavers |
| 5,105,445 A | 4/1992 | Karam et al. |
| 5,107,520 A | 4/1992 | Karam et al. |
| 5,121,412 A | 6/1992 | Borth |
| 5,132,639 A | 7/1992 | Blauelt et al. |
| 5,396,190 A | 3/1995 | Murata |
| 5,404,378 A | 4/1995 | Kimura |
| 5,457,557 A | 10/1995 | Zarem et al. |
| 5,486,789 A | 1/1996 | Palandech et al. |
| 5,524,286 A | 6/1996 | Chiesa et al. |
| 5,579,341 A | 11/1996 | Smith et al. |
| 5,579,342 A | 11/1996 | Crozier |
| 5,589,797 A | 12/1996 | Gans et al. |
| 5,596,600 A | 1/1997 | Dimos et al. |
| 5,619,202 A | 4/1997 | Wilson et al. |
| 5,621,730 A | 4/1997 | Kelley |
| 5,627,879 A | 5/1997 | Russell et al. |
| 5,644,622 A | 7/1997 | Russell et al. |
| 5,655,220 A | 8/1997 | Weiland et al. |
| 5,675,287 A | 10/1997 | Baker et al. |
| 5,678,198 A | 10/1997 | Lemson |
| 5,699,383 A | 12/1997 | Ichiyoshi |
| 5,732,333 A | 3/1998 | Cox et al. |
| 5,740,520 A | 4/1998 | Cyze et al. |
| 5,748,683 A | 5/1998 | Smith et al. |
| 5,757,229 A | 5/1998 | Mitzlaff |
| 5,786,728 A | 7/1998 | Alinikula |
| 5,794,153 A | 8/1998 | Ariyavisitakul et al. |
| 5,810,888 A | 9/1998 | Fenn |
| 5,818,883 A | 10/1998 | Smith et al. |
| 5,831,479 A | 11/1998 | Leffel et al. |
| 5,852,651 A | 12/1998 | Fischer et al. |
| 5,870,668 A | 2/1999 | Takano et al. |
| 5,880,863 A | 3/1999 | Rideout et al. |
| 5,898,338 A | 4/1999 | Proctor et al. |
| 5,920,808 A | 7/1999 | Jones et al. |
| 5,923,712 A | 7/1999 | Leyendecker et al. |
| 5,936,464 A | 8/1999 | Grondahl |
| 5,937,011 A | 8/1999 | Carney et al. |
| 5,949,283 A | 9/1999 | Proctor et al. |
| 5,959,499 A | 9/1999 | Khan et al. |
| 5,959,500 A | 9/1999 | Garrido |
| 5,963,549 A | 10/1999 | Perkins et al. |
| 5,973,011 A | 10/1999 | Noack et al. |
| 6,005,506 A | 12/1999 | Bazarjani et al. |
| 6,005,884 A | 12/1999 | Cook et al. |
| 6,014,366 A | 1/2000 | Ichiyoshi |
| 6,054,896 A | 4/2000 | Wright et al. |
| 6,055,418 A | 4/2000 | Harris et al. |
| 6,081,158 A | 6/2000 | Twitchell et al. |
| 6,091,941 A | 7/2000 | Moriyama et al. |
| 6,112,086 A | 8/2000 | Wala |
| 6,124,758 A | 9/2000 | Korte et al. |
| 6,141,390 A | 10/2000 | Cova |
| 6,166,601 A | 12/2000 | Shalom et al. |
| 6,208,698 B1 | 3/2001 | Marchesani et al. |
| 6,215,354 B1 | 4/2001 | Kolanek et al. |
| 6,236,267 B1 | 5/2001 | Anzil |
| 6,240,144 B1 | 5/2001 | Ha |
| 6,242,979 B1 | 6/2001 | Li |
| 6,246,286 B1 | 6/2001 | Persson |
| 6,246,865 B1 | 6/2001 | Lee |
| 6,252,912 B1 | 6/2001 | Salinger |
| 6,253,094 B1 | 6/2001 | Schmutz |
| 6,266,531 B1 | 7/2001 | Zadeh et al. |
| 6,275,685 B1 | 8/2001 | Wessel et al. |
| 6,288,610 B1 | 9/2001 | Miyashita |
| 6,301,579 B1 | 10/2001 | Becker |
| 6,313,703 B1 | 11/2001 | Wright et al. |
| 6,314,142 B1 | 11/2001 | Perthold et al. |
| 6,315,189 B1 | 11/2001 | Williams |
| 6,320,463 B1 | 11/2001 | Leva et al. |
| 6,351,189 B1 | 2/2002 | Hirvilampi |
| 6,353,600 B1 | 3/2002 | Schwartz et al. |
| 6,356,146 B1 | 3/2002 | Wright et al. |
| 6,356,369 B1 | 3/2002 | Farhan |
| 6,356,555 B1 | 3/2002 | Rakib et al. |
| 6,359,504 B1 | 3/2002 | Cozzarelli |
| 6,373,611 B1 | 4/2002 | Farhan et al. |
| 6,373,902 B1 | 4/2002 | Park et al. |
| 6,388,518 B1 | 5/2002 | Miyatani |
| 6,393,007 B1 | 5/2002 | Haartsen |
| 6,400,774 B1 | 6/2002 | Matsuoka et al. |
| 6,424,225 B1 | 7/2002 | Choi et al. |
| 6,430,402 B1 | 8/2002 | Agahi-Kesheh |
| 6,437,644 B1 | 8/2002 | Kenington |
| 6,489,846 B2 | 12/2002 | Hatsugai |
| 6,493,335 B1 | 12/2002 | Darcie et al. |
| 6,512,417 B2 | 1/2003 | Booth et al. |
| 6,549,067 B1 | 4/2003 | Kenington |
| 6,552,609 B2 | 4/2003 | Hamada et al. |
| 6,552,634 B1 | 4/2003 | Raab |
| 6,566,944 B1 | 5/2003 | Pehlke et al. |
| 6,587,514 B1 | 7/2003 | Wright et al. |
| 6,591,090 B1 | 7/2003 | Vuorio et al. |
| 6,594,496 B2 | 7/2003 | Schwartz |
| 6,600,406 B1 | 7/2003 | Ha |
| 6,600,792 B2 | 7/2003 | Antonio et al. |
| 6,614,854 B1 | 9/2003 | Chow et al. |
| 6,625,429 B1 | 9/2003 | Yamashita |
| 6,639,050 B1 | 10/2003 | Kieliszewski |
| 6,639,463 B1 | 10/2003 | Ghanadan et al. |
| 6,639,466 B2 | 10/2003 | Johnson |
| 6,639,950 B1 | 10/2003 | Lagerblom et al. |
| 6,657,993 B1 | 12/2003 | Casanova et al. |
| 6,677,870 B2 | 1/2004 | Im et al. |
| 6,697,436 B1 | 2/2004 | Wright et al. |
| 6,697,603 B1 | 2/2004 | Lovinggood et al. |
| 6,703,897 B2 | 3/2004 | O'Flaherty et al. |
| 6,704,545 B1 | 3/2004 | Wala |
| 6,724,737 B1 | 4/2004 | Boyden et al. |
| 6,741,662 B1 | 5/2004 | Francos et al. |
| 6,741,663 B1 | 5/2004 | Tapio et al. |
| 6,741,867 B1 | 5/2004 | Tetsuya |

(56) References Cited

U.S. PATENT DOCUMENTS

| | | | |
|---|---|---|---|
| 6,747,649 B1 | 6/2004 | Sanz-Pastor et al. |
| 6,751,447 B1 | 6/2004 | Jin et al. |
| 6,785,558 B1 | 8/2004 | Stratford et al. |
| 6,794,931 B2 | 9/2004 | Kenington |
| 6,801,767 B1 | 10/2004 | Schwartz et al. |
| 6,804,540 B1 | 10/2004 | Shepherd et al. |
| 6,826,164 B2 | 11/2004 | Mani et al. |
| 6,831,901 B2 | 12/2004 | Millar |
| 6,836,660 B1 | 12/2004 | Wala |
| 6,885,241 B2 | 4/2005 | Huang et al. |
| 6,898,252 B1 | 5/2005 | Yellin et al. |
| 6,907,085 B2 | 6/2005 | Kubo et al. |
| 6,963,242 B2 | 11/2005 | White et al. |
| 6,963,552 B2 | 11/2005 | Sabat, Jr. et al. |
| 6,973,139 B2 | 12/2005 | Ahn et al. |
| 6,980,527 B1 | 12/2005 | Liu et al. |
| 6,983,025 B2 | 1/2006 | Schell |
| 6,985,704 B2 | 1/2006 | Yang et al. |
| 6,998,909 B1 | 2/2006 | Mauer |
| 7,023,273 B2 | 4/2006 | Johnson et al. |
| 7,031,749 B1 | 4/2006 | Mitama |
| 7,034,612 B2 | 4/2006 | Kim |
| 7,035,345 B2 | 4/2006 | Jeckeln et al. |
| 7,042,287 B2 | 4/2006 | Robinson |
| 7,061,314 B2 | 6/2006 | Kwon et al. |
| 7,064,606 B2 | 6/2006 | Louis |
| 7,068,984 B2 | 6/2006 | Mathe et al. |
| 7,071,777 B2 | 7/2006 | McBeath et al. |
| 7,079,818 B2 | 7/2006 | Khorram |
| 7,098,734 B2 | 8/2006 | Hongo et al. |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,123,890 B2 | 10/2006 | Kenington et al. |
| 7,145,704 B1 | 12/2006 | Islam |
| 7,151,913 B2 | 12/2006 | Ahmed |
| 7,158,765 B2 | 1/2007 | Blair et al. |
| 7,190,222 B2 | 3/2007 | Okazaki et al. |
| 7,193,471 B2 | 3/2007 | Tsutsui et al. |
| 7,193,472 B2 | 3/2007 | Gotou et al. |
| 7,197,085 B1 | 3/2007 | Vella-Coleiro |
| 7,248,642 B1 | 7/2007 | Vella-Coleiro |
| 7,251,293 B2 | 7/2007 | Vella-Coleiro |
| 7,257,328 B2 | 8/2007 | Levinson et al. |
| 7,259,630 B2 | 8/2007 | Bachman, II et al. |
| 7,283,519 B2 | 10/2007 | Girard |
| 7,286,507 B1 | 10/2007 | Oh et al. |
| 7,301,402 B2 | 11/2007 | Norris et al. |
| 7,321,635 B2 | 1/2008 | Ocenasek et al. |
| 7,321,636 B2 | 1/2008 | Harel et al. |
| 7,333,559 B2 | 2/2008 | Song et al. |
| 7,339,891 B2 | 3/2008 | Binder et al. |
| 7,339,897 B2 | 3/2008 | Larsson et al. |
| 7,362,776 B2 | 4/2008 | Meier et al. |
| 7,372,918 B2 | 5/2008 | Muller et al. |
| 7,409,007 B1 | 8/2008 | Johnson et al. |
| 7,469,491 B2 | 12/2008 | McCallister et al. |
| 7,489,632 B2 | 2/2009 | Lakkakorpi |
| 7,493,094 B2 | 2/2009 | Ichitsubo et al. |
| 7,496,367 B1 | 2/2009 | Ozturk et al. |
| 7,593,710 B2 | 9/2009 | Brigaud et al. |
| 7,610,460 B2 | 10/2009 | Watanabe et al. |
| 7,634,536 B2 | 12/2009 | Halasz |
| 7,639,982 B2 | 12/2009 | Wala |
| 7,650,112 B2 | 1/2010 | Utsumi et al. |
| 7,702,300 B1 | 4/2010 | McCune |
| 7,765,294 B2 | 7/2010 | Edwards et al. |
| 7,787,854 B2 | 8/2010 | Conyers et al. |
| 7,801,038 B2 | 9/2010 | Liao et al. |
| 7,826,369 B2 | 11/2010 | Filsfils et al. |
| 7,826,810 B2 | 11/2010 | Carmel et al. |
| 7,831,221 B2 | 11/2010 | Leffel et al. |
| 7,848,747 B2 | 12/2010 | Wala |
| 7,848,770 B2 | 12/2010 | Scheinert |
| 7,855,977 B2 | 12/2010 | Morrison et al. |
| RE42,287 E | 4/2011 | Apodaca et al. |
| 8,010,099 B2 | 8/2011 | Ma et al. |
| 8,010,116 B2 | 8/2011 | Scheinert |
| 8,032,148 B2 | 10/2011 | Hettstedt et al. |
| 8,036,226 B1 | 10/2011 | Ma et al. |
| 8,064,850 B2 | 11/2011 | Yang et al. |
| 8,098,572 B2 | 1/2012 | Zhou et al. |
| 8,112,094 B1 | 2/2012 | Wellington |
| 8,139,492 B1 | 3/2012 | Peterson et al. |
| 8,149,950 B2 | 4/2012 | Kim et al. |
| 8,213,401 B2 | 7/2012 | Fischer et al. |
| 8,213,884 B2 | 7/2012 | Kim et al. |
| 8,274,332 B2 | 9/2012 | Cho et al. |
| 8,326,218 B2 | 12/2012 | Wala |
| 8,326,238 B2 | 12/2012 | Yang et al. |
| 8,346,091 B2 | 1/2013 | Kummetz et al. |
| 8,346,160 B2 | 1/2013 | Kummetz |
| 8,351,877 B2 | 1/2013 | Kim et al. |
| 8,363,628 B2 | 1/2013 | Chi et al. |
| 8,369,272 B2 | 2/2013 | Barbaresi et al. |
| 8,380,143 B2 * | 2/2013 | Yang .............. H04B 1/0475 |
| | | 455/114.3 |
| 8,401,499 B2 | 3/2013 | Kim et al. |
| 8,446,530 B2 | 5/2013 | Bellers |
| 8,451,735 B2 | 5/2013 | Li |
| 8,472,897 B1 | 6/2013 | Yang |
| 8,478,331 B1 | 7/2013 | Rogers et al. |
| 8,509,347 B2 | 8/2013 | Kim et al. |
| 8,520,603 B2 | 8/2013 | Kozisek et al. |
| 8,527,003 B2 | 9/2013 | Gupta et al. |
| 8,532,242 B2 | 9/2013 | Fischer et al. |
| 8,542,768 B2 | 9/2013 | Kim et al. |
| 8,548,403 B2 | 10/2013 | Kim et al. |
| 8,548,526 B2 | 10/2013 | Schmidt et al. |
| 8,577,286 B2 | 11/2013 | Wala |
| 8,583,100 B2 | 11/2013 | Koziy et al. |
| 8,620,234 B2 | 12/2013 | Yang et al. |
| 8,681,917 B2 | 3/2014 | McAllister et al. |
| 8,682,338 B2 | 3/2014 | Lemson et al. |
| 8,730,786 B2 | 5/2014 | Wang et al. |
| 8,731,495 B2 | 5/2014 | Yang et al. |
| 8,737,300 B2 | 5/2014 | Stapleton et al. |
| 8,737,454 B2 | 5/2014 | Wala et al. |
| 8,804,870 B2 | 8/2014 | Kim et al. |
| 8,811,917 B2 | 8/2014 | Kim et al. |
| 8,842,649 B2 | 9/2014 | Liu et al. |
| 8,855,489 B2 | 10/2014 | Boldi et al. |
| 8,958,789 B2 | 2/2015 | Bauman et al. |
| 9,026,067 B2 | 5/2015 | Stapleton et al. |
| 9,031,521 B2 | 5/2015 | Yang et al. |
| 9,054,758 B2 | 6/2015 | Yang et al. |
| 9,077,297 B2 * | 7/2015 | Yang .............. H03F 1/3241 |
| 9,137,078 B2 | 9/2015 | Stapleton et al. |
| 9,148,324 B2 | 9/2015 | Stapleton et al. |
| 9,374,196 B2 | 6/2016 | Yang et al. |
| 9,419,714 B2 | 8/2016 | Lemson et al. |
| 9,419,837 B2 | 8/2016 | Stapleton et al. |
| 9,531,473 B2 | 12/2016 | Lemson et al. |
| 9,742,446 B2 | 8/2017 | Yang et al. |
| 9,768,739 B2 | 9/2017 | Kim et al. |
| 9,820,171 B2 | 11/2017 | Lemson et al. |
| 10,045,314 B2 | 8/2018 | Stapleton et al. |
| 10,080,178 B2 | 9/2018 | Stapleton et al. |
| 1,009,714 A1 | 10/2018 | Yang et al. |
| 10,097,142 B2 * | 10/2018 | Yang .............. H03F 3/24 |
| 10,159,074 B2 | 12/2018 | Lemson et al. |
| 1,030,552 A1 | 5/2019 | Yang et al. |
| 10,334,499 B2 | 6/2019 | Stapleton et al. |
| 1,069,342 A1 | 6/2020 | Yang et al. |
| 10,693,425 B2 * | 6/2020 | Yang .............. H03F 1/3247 |
| 2001/0005402 A1 | 6/2001 | Nagatani et al. |
| 2001/0034223 A1 | 10/2001 | Rieser et al. |
| 2001/0051504 A1 | 12/2001 | Kubo et al. |
| 2002/0025790 A1 | 2/2002 | Matsuoka |
| 2002/0034260 A1 | 3/2002 | Kim |
| 2002/0041208 A1 | 4/2002 | Hamada et al. |

(56) References Cited

U.S. PATENT DOCUMENTS

| | | |
|---|---|---|
| 2002/0041209 A1 | 4/2002 | Miyatani |
| 2002/0044014 A1 | 4/2002 | Wright et al. |
| 2002/0075906 A1 | 6/2002 | Cole et al. |
| 2002/0080891 A1 | 6/2002 | Ahn et al. |
| 2002/0086675 A1 | 7/2002 | Mansour |
| 2002/0093926 A1 | 7/2002 | Kilfoyle |
| 2002/0097085 A1 | 7/2002 | Stapleton |
| 2002/0101937 A1 | 8/2002 | Antonio et al. |
| 2002/0101938 A1 | 8/2002 | Horaguchi et al. |
| 2002/0158689 A1 | 10/2002 | Harris et al. |
| 2002/0179830 A1 | 12/2002 | Pearson et al. |
| 2002/0186436 A1 | 12/2002 | Mani et al. |
| 2002/0186783 A1 | 12/2002 | Opas et al. |
| 2002/0187761 A1 | 12/2002 | Im et al. |
| 2002/0187809 A1 | 12/2002 | Mani et al. |
| 2002/0191565 A1 | 12/2002 | Mani et al. |
| 2002/0191710 A1 | 12/2002 | Jeckeln et al. |
| 2002/0193085 A1 | 12/2002 | Mathe et al. |
| 2002/0193087 A1 | 12/2002 | Kim |
| 2003/0021263 A1 | 1/2003 | Lee |
| 2003/0021278 A1 | 1/2003 | Domschitz et al. |
| 2003/0035494 A1 | 2/2003 | Bauder et al. |
| 2003/0058959 A1 | 3/2003 | Rafie et al. |
| 2003/0095608 A1 | 5/2003 | Duperray |
| 2003/0098752 A1 | 5/2003 | Haghighat |
| 2003/0104792 A1 | 6/2003 | Doi |
| 2003/0112068 A1 | 6/2003 | Kenington |
| 2003/0137932 A1 | 7/2003 | Nishioka et al. |
| 2003/0143947 A1 | 7/2003 | Lyu |
| 2003/0146787 A1 | 8/2003 | Hedberg et al. |
| 2003/0179829 A1 | 9/2003 | Pinckley et al. |
| 2003/0179830 A1 | 9/2003 | Eidson et al. |
| 2003/0181221 A1 | 9/2003 | Nguyen |
| 2003/0207680 A1 | 11/2003 | Yang et al. |
| 2003/0227981 A1 | 12/2003 | Vella-Coleiro et al. |
| 2003/0228856 A1 | 12/2003 | Orihashi et al. |
| 2003/0234688 A1 | 12/2003 | Matsuyoshi et al. |
| 2004/0017859 A1 | 1/2004 | Sits et al. |
| 2004/0032912 A1 | 2/2004 | Ocenasek et al. |
| 2004/0053624 A1 | 3/2004 | Frank et al. |
| 2004/0105509 A1 | 6/2004 | McGowan et al. |
| 2004/0136470 A1 | 7/2004 | DeBruyn et al. |
| 2004/0142667 A1 | 7/2004 | Lohhead et al. |
| 2004/0179587 A1 | 9/2004 | Kenington et al. |
| 2004/0180634 A1* | 9/2004 | Kenington ............ H03F 1/3294 455/113 |
| 2004/0183672 A1 | 9/2004 | Krishan et al. |
| 2004/0203542 A1 | 10/2004 | Seo et al. |
| 2004/0208259 A1 | 10/2004 | Hunton |
| 2004/0212428 A1 | 10/2004 | Ode et al. |
| 2004/0240585 A1 | 12/2004 | Bishop et al. |
| 2004/0247042 A1 | 12/2004 | Sahlman |
| 2005/0008096 A1 | 1/2005 | Iwasaki et al. |
| 2005/0059360 A1 | 3/2005 | Kenington |
| 2005/0068102 A1 | 3/2005 | Hongo et al. |
| 2005/0079834 A1 | 4/2005 | Maniwa et al. |
| 2005/0143091 A1 | 6/2005 | Shapira et al. |
| 2005/0152695 A1 | 7/2005 | Sulzberger et al. |
| 2005/0157675 A1 | 7/2005 | Feder et al. |
| 2005/0157814 A1 | 7/2005 | Cova et al. |
| 2005/0159117 A1 | 7/2005 | Bausov et al. |
| 2005/0164667 A1 | 7/2005 | Pan et al. |
| 2005/0174954 A1 | 8/2005 | Yun et al. |
| 2005/0180526 A1 | 8/2005 | Kim et al. |
| 2005/0180527 A1 | 8/2005 | Suzuki et al. |
| 2005/0181812 A1 | 8/2005 | Scheck |
| 2005/0190857 A1 | 9/2005 | Braithwaite |
| 2005/0195919 A1 | 9/2005 | Cova |
| 2005/0206564 A1 | 9/2005 | Mao et al. |
| 2005/0220066 A1 | 10/2005 | Wal et al. |
| 2005/0226346 A1 | 10/2005 | Ode et al. |
| 2005/0253652 A1 | 11/2005 | Song et al. |
| 2005/0258898 A1 | 11/2005 | Hongo |
| 2005/0262498 A1 | 11/2005 | Ferguson et al. |
| 2006/0012426 A1 | 1/2006 | Nezami |
| 2006/0012427 A1 | 1/2006 | Nezami |
| 2006/0067426 A1 | 3/2006 | Maltsev et al. |
| 2006/0094470 A1 | 5/2006 | Wake et al. |
| 2006/0109052 A1 | 5/2006 | Saed et al. |
| 2006/0121858 A1 | 6/2006 | Tanaka et al. |
| 2006/0121944 A1 | 6/2006 | Buscaglia et al. |
| 2006/0141957 A1 | 6/2006 | Fischer et al. |
| 2006/0214729 A1 | 9/2006 | Furuya et al. |
| 2006/0217083 A1 | 9/2006 | Braithwaite |
| 2006/0226903 A1 | 10/2006 | Muller et al. |
| 2006/0238245 A1 | 10/2006 | Carichner et al. |
| 2006/0239266 A1 | 10/2006 | Babbar et al. |
| 2006/0240786 A1 | 10/2006 | Liu |
| 2006/0262880 A1 | 11/2006 | Mizuta et al. |
| 2006/0270366 A1 | 11/2006 | Rozenblit et al. |
| 2006/0276147 A1 | 12/2006 | Suzuki et al. |
| 2007/0019598 A1 | 1/2007 | Prehofer |
| 2007/0057737 A1 | 3/2007 | Davis et al. |
| 2007/0058742 A1 | 3/2007 | Demarco et al. |
| 2007/0064506 A1 | 3/2007 | Bauman et al. |
| 2007/0065078 A1 | 3/2007 | Jiang |
| 2007/0066234 A1 | 3/2007 | Lastinger et al. |
| 2007/0075780 A1 | 4/2007 | Krvavac et al. |
| 2007/0116046 A1 | 5/2007 | Liu et al. |
| 2007/0121543 A1 | 5/2007 | Kuchibhotla et al. |
| 2007/0135065 A1 | 6/2007 | Leffel et al. |
| 2007/0147488 A1 | 6/2007 | Han |
| 2007/0171234 A1 | 7/2007 | Crawfis et al. |
| 2007/0177552 A1 | 8/2007 | Wu et al. |
| 2007/0190952 A1 | 8/2007 | Waheed et al. |
| 2007/0223614 A1 | 9/2007 | Kuchibhotla et al. |
| 2007/0241812 A1 | 10/2007 | Yang et al. |
| 2007/0264947 A1 | 11/2007 | Rozenblit et al. |
| 2007/0273439 A1 | 11/2007 | Lin et al. |
| 2007/0281643 A1 | 12/2007 | Kawai |
| 2007/0296494 A1 | 12/2007 | Hongo |
| 2008/0031380 A1 | 2/2008 | Takabayashi |
| 2008/0045254 A1 | 2/2008 | Gupta et al. |
| 2008/0051129 A1 | 2/2008 | Abe et al. |
| 2008/0058018 A1 | 3/2008 | Scheinert |
| 2008/0068191 A1 | 3/2008 | Maeda et al. |
| 2008/0069032 A1 | 3/2008 | Liu |
| 2008/0070632 A1 | 3/2008 | Obuchi et al. |
| 2008/0089689 A1 | 4/2008 | Sakama |
| 2008/0094139 A1 | 4/2008 | Takano et al. |
| 2008/0107014 A1 | 5/2008 | Huang et al. |
| 2008/0119198 A1 | 5/2008 | Hettstedt et al. |
| 2008/0139140 A1* | 6/2008 | Matero ................ H03F 1/3241 455/114.3 |
| 2008/0146146 A1 | 6/2008 | Binder et al. |
| 2008/0152037 A1 | 6/2008 | Kim et al. |
| 2008/0165882 A1 | 7/2008 | Hedayat et al. |
| 2008/0225816 A1 | 9/2008 | Osterling et al. |
| 2008/0240036 A1 | 10/2008 | Liu et al. |
| 2008/0240286 A1 | 10/2008 | Zhang et al. |
| 2008/0265996 A1 | 10/2008 | Kim et al. |
| 2009/0003196 A1 | 1/2009 | Capece et al. |
| 2009/0013317 A1 | 1/2009 | Abfalter et al. |
| 2009/0046586 A1 | 2/2009 | Stuart et al. |
| 2009/0060088 A1 | 3/2009 | Callard et al. |
| 2009/0060496 A1 | 3/2009 | Liu et al. |
| 2009/0082010 A1 | 3/2009 | Lee et al. |
| 2009/0088093 A1 | 4/2009 | Nentwig |
| 2009/0146736 A1 | 6/2009 | Kim et al. |
| 2009/0146870 A1 | 6/2009 | Thome et al. |
| 2009/0154621 A1 | 6/2009 | Shapira et al. |
| 2009/0170543 A1 | 7/2009 | Mostafa et al. |
| 2009/0180407 A1 | 7/2009 | Sabt et al. |
| 2009/0180426 A1 | 7/2009 | Sabat et al. |
| 2009/0180462 A1 | 7/2009 | Duerdodt et al. |
| 2009/0191891 A1 | 7/2009 | Ma et al. |
| 2009/0213972 A1 | 8/2009 | Maunuksela et al. |
| 2009/0238566 A1 | 9/2009 | Boldi et al. |
| 2009/0252094 A1 | 10/2009 | Chang et al. |
| 2009/0252136 A1 | 10/2009 | Mahany et al. |
| 2009/0274048 A1 | 11/2009 | Sambhwani et al. |
| 2009/0274085 A1 | 11/2009 | Wang et al. |
| 2009/0286484 A1 | 11/2009 | Phung et al. |
| 2010/0002661 A1 | 1/2010 | Schmidt et al. |

(56) References Cited

U.S. PATENT DOCUMENTS

| | | |
|---|---|---|
| 2010/0075678 A1 | 3/2010 | Akman et al. |
| 2010/0087227 A1 | 4/2010 | Francos et al. |
| 2010/0112981 A1 | 5/2010 | Suh et al. |
| 2010/0118921 A1 | 5/2010 | Abdelmonem et al. |
| 2010/0128676 A1 | 5/2010 | Wu et al. |
| 2010/0130130 A1 | 5/2010 | Liu |
| 2010/0136932 A1 | 6/2010 | Osterling et al. |
| 2010/0136998 A1 | 6/2010 | Lott et al. |
| 2010/0157901 A1 | 6/2010 | Sanderovitz et al. |
| 2010/0177759 A1 | 7/2010 | Fischer et al. |
| 2010/0177760 A1 | 7/2010 | Cannon et al. |
| 2010/0178936 A1 | 7/2010 | Wala et al. |
| 2010/0182984 A1 | 7/2010 | Herscovici et al. |
| 2010/0202565 A1 | 8/2010 | Abbasfar |
| 2010/0238904 A1 | 9/2010 | Zhang et al. |
| 2010/0247105 A1 | 9/2010 | Yu |
| 2010/0278530 A1 | 11/2010 | Kummetz et al. |
| 2010/0279704 A1 | 11/2010 | Vachhani |
| 2010/0291949 A1 | 11/2010 | Shapira et al. |
| 2010/0296816 A1 | 11/2010 | Larsen |
| 2010/0299173 A1 | 11/2010 | Zampiello et al. |
| 2010/0304773 A1 | 12/2010 | Ramprashad |
| 2010/0311372 A1 | 12/2010 | Bouyaaud et al. |
| 2010/0324814 A1 | 12/2010 | Wu et al. |
| 2011/0009056 A1 | 1/2011 | Hanson et al. |
| 2011/0069657 A1 | 3/2011 | Gholmieh et al. |
| 2011/0103309 A1 | 5/2011 | Wang et al. |
| 2011/0135013 A1 | 6/2011 | Wegener |
| 2011/0135308 A1 | 6/2011 | Tarlazzi et al. |
| 2011/0158116 A1 | 6/2011 | Tenny et al. |
| 2011/0195673 A1 | 8/2011 | Pratt et al. |
| 2011/0223958 A1 | 9/2011 | Chen et al. |
| 2011/0237178 A1 | 9/2011 | Seki et al. |
| 2011/0241425 A1 | 10/2011 | Hunter, Jr. et al. |
| 2011/0249708 A1 | 10/2011 | Maca |
| 2011/0281579 A1 | 11/2011 | Kummetz |
| 2011/0287791 A1 | 11/2011 | Fujishima et al. |
| 2012/0002586 A1 | 1/2012 | Gainey et al. |
| 2012/0039254 A1 | 2/2012 | Stapleton et al. |
| 2012/0057572 A1 | 3/2012 | Evans et al. |
| 2012/0127938 A1 | 5/2012 | Lv et al. |
| 2012/0147993 A1 | 6/2012 | Kim et al. |
| 2012/0150521 A1 | 6/2012 | Balkwill |
| 2012/0230382 A1 | 9/2012 | Kim et al. |
| 2012/0281565 A1 | 11/2012 | Sauer |
| 2013/0214861 A1 | 8/2013 | Kim et al. |
| 2013/0272202 A1 | 10/2013 | Stapleton et al. |
| 2013/0315291 A1 | 11/2013 | Kim et al. |
| 2014/0126914 A1 | 5/2014 | Berlin et al. |
| 2014/0286247 A1 | 9/2014 | Lemson et al. |
| 2014/0313884 A1 | 10/2014 | Stapleton et al. |
| 2014/0327481 A1 | 11/2014 | Kim et al. |
| 2015/0092830 A1 | 4/2015 | Kim et al. |
| 2016/0014782 A1 | 1/2016 | Stapleton et al. |
| 2016/0080082 A1 | 3/2016 | Lemson et al. |
| 2016/0269210 A1 | 9/2016 | Kim et al. |
| 2017/0033969 A1 | 2/2017 | Yang et al. |
| 2017/0055198 A1 | 2/2017 | Stapleton et al. |
| 2017/0181008 A1 | 6/2017 | Fischer |
| 2017/0214420 A1 | 7/2017 | Phillips et al. |
| 2017/0238318 A1 | 8/2017 | Lemson et al. |
| 2018/0102747 A1 | 4/2018 | Kim et al. |
| 2018/0279197 A1 | 9/2018 | Kim et al. |
| 2019/0208523 A1 | 7/2019 | Lemson et al. |
| 2019/0288900 A1 | 9/2019 | Yang et al. |
| 2020/0083914 A1 | 3/2020 | Yang et al. |
| 2020/0092787 A1 | 3/2020 | Stapleton et al. |
| 2020/0136567 A1 | 4/2020 | Kim et al. |
| 2020/0146015 A1 | 5/2020 | Lemson et al. |
| 2020/0169937 A1 | 5/2020 | Kim et al. |
| 2020/0267732 A1 | 8/2020 | Lemson et al. |

FOREIGN PATENT DOCUMENTS

| | | |
|---|---|---|
| CN | 1349679 A | 5/2002 |
| CN | 1462153 A | 12/2003 |
| CN | 1518209 A | 8/2004 |
| CN | 1524390 A | 8/2004 |
| CN | 1531213 | 9/2004 |
| CN | 1578119 A | 2/2005 |
| CN | 1605152 A | 4/2005 |
| CN | 1640086 A | 7/2005 |
| CN | 1700591 A | 11/2005 |
| CN | 1774094 A | 5/2006 |
| CN | 1838530 A | 6/2006 |
| CN | 100426897 A | 7/2006 |
| CN | 1866731 A | 11/2006 |
| CN | 1983801 A | 6/2007 |
| CN | 100341292 C | 10/2007 |
| CN | 201127027 Y | 10/2008 |
| CN | 101394647 A | 3/2009 |
| CN | 101433124 A | 5/2009 |
| CN | 101453699 A | 6/2009 |
| CN | 101453799 A | 6/2009 |
| CN | 101521893 A | 9/2009 |
| CN | 101523969 A | 9/2009 |
| CN | 201307942 Y | 9/2009 |
| CN | 101621806 A | 1/2010 |
| CN | 101720528 A | 6/2010 |
| CN | 101754229 A | 6/2010 |
| CN | 101754431 A | 6/2010 |
| CN | 102460385 A | 5/2012 |
| CN | 103201958 A | 7/2013 |
| CN | 104202279 A | 12/2014 |
| EP | 0368673 A1 | 5/1990 |
| EP | 0642243 A1 | 3/1995 |
| EP | 1118234 A1 | 7/2001 |
| EP | 1227605 A2 | 7/2002 |
| EP | 1713290 A1 | 10/2006 |
| EP | 1798853 A | 6/2007 |
| EP | 2430531 A1 | 3/2012 |
| EP | 2606576 A1 | 6/2013 |
| IN | 8527/CHENP/2011 A | 3/2013 |
| JP | 1992-207532 A | 7/1992 |
| JP | 1993-136724 A | 1/1993 |
| JP | H09-284149 A | 10/1997 |
| JP | 2000-092412 A | 3/2000 |
| JP | 2000-512107 A | 9/2000 |
| JP | 2000-278237 A | 10/2000 |
| JP | 2001-268032 A | 6/2001 |
| JP | 2001-508954 A | 7/2001 |
| JP | 2001-217885 | 8/2001 |
| JP | 2001-244757 A | 9/2001 |
| JP | 2002-158615 A | 5/2002 |
| JP | 2002-536902 A | 10/2002 |
| JP | 2003-168931 A | 6/2003 |
| JP | 2003-304122 A | 10/2003 |
| JP | 2004-015364 A | 1/2004 |
| JP | 2004-147009 A | 5/2004 |
| JP | 2005-020675 A | 1/2005 |
| JP | 2005-033632 A | 2/2005 |
| JP | 2005-101908 A | 4/2005 |
| JP | 2005-150932 A | 6/2005 |
| JP | 2005-217714 A | 8/2005 |
| JP | 2005-333353 A | 12/2005 |
| JP | 2006-505160 A | 2/2006 |
| JP | 2006-340166 A | 12/2006 |
| JP | 2007-006163 A | 1/2007 |
| JP | 2007-020157 A | 1/2007 |
| JP | 2007-104018 A | 4/2007 |
| JP | 2007-195056 A | 8/2007 |
| JP | 2007-523577 A | 8/2007 |
| JP | 2007-235738 A | 9/2007 |
| JP | 2007-529926 A | 10/2007 |
| JP | 2008-506322 A | 2/2008 |
| JP | 2008-099137 A | 4/2008 |
| JP | 2008-516503 A | 5/2008 |
| JP | 2008-135955 A | 6/2008 |
| JP | 2009-038688 A | 2/2009 |
| JP | 2009-296335 A | 12/2009 |
| JP | 2010-509816 A | 3/2010 |

(56) References Cited

FOREIGN PATENT DOCUMENTS

| | | |
|---|---|---|
| JP | 2010-166531 A | 7/2010 |
| JP | 2010-525758 A | 7/2010 |
| JP | 2010-541297 A | 12/2010 |
| JP | 2012-525093 A | 10/2012 |
| KR | 10-1996-0702978 A | 5/1996 |
| KR | 10-2000-0016621 | 3/2000 |
| KR | 2000-0039780 | 7/2000 |
| KR | 10-2004-0054420 | 6/2004 |
| KR | 10-2005-0006725 | 1/2005 |
| KR | 10-2005-0052556 | 6/2005 |
| KR | 10-2006-0109997 A | 10/2006 |
| KR | 2009-0088083 A | 8/2009 |
| KR | 10-2010-017270 A | 2/2010 |
| KR | 10-2010-0107065 A | 10/2010 |
| KR | 10-2014-0026321 A | 3/2014 |
| TW | I261419 B | 9/2006 |
| WO | 94/28690 A1 | 12/1994 |
| WO | WO 97/48181 | 12/1997 |
| WO | 98/24256 A2 | 6/1998 |
| WO | 00/23956 A1 | 4/2000 |
| WO | WO 00/46916 | 8/2000 |
| WO | WO 01/08296 | 2/2001 |
| WO | 01/56197 A2 | 8/2001 |
| WO | 02/23956 A2 | 3/2002 |
| WO | 02/47414 A2 | 6/2002 |
| WO | 02/056481 A2 | 7/2002 |
| WO | 02/102102 A1 | 12/2002 |
| WO | WO 2004/040870 | 5/2004 |
| WO | WO 2005/076495 | 8/2005 |
| WO | WO 2006/025213 | 3/2006 |
| WO | 2006/040653 A1 | 4/2006 |
| WO | WO 2006/087864 | 8/2006 |
| WO | WO 2006/102278 | 9/2006 |
| WO | WO 2007/004252 | 1/2007 |
| WO | 2007/127543 A2 | 11/2007 |
| WO | 2008/036976 A2 | 3/2008 |
| WO | 2008/061701 A1 | 5/2008 |
| WO | WO 2008/078195 | 7/2008 |
| WO | WO 2008/105775 | 9/2008 |
| WO | WO 2008/154077 | 12/2008 |
| WO | WO 2008/155610 | 12/2008 |
| WO | 2009/097237 A1 | 8/2009 |
| WO | WO 2009/109808 | 9/2009 |
| WO | 2009/151893 A2 | 12/2009 |
| WO | 2010/008794 A2 | 1/2010 |
| WO | 2010/083115 A2 | 7/2010 |
| WO | 2008/146394 A1 | 8/2010 |
| WO | WO 2010/124297 | 10/2010 |
| WO | 2010/133942 A1 | 11/2010 |
| WO | 2012/024343 A1 | 2/2012 |
| WO | 2012/024345 A2 | 2/2012 |
| WO | 2012/024349 A1 | 2/2012 |
| WO | 2010/087031 A1 | 7/2012 |

OTHER PUBLICATIONS

U.S. Appl. No. 60/795,820, filed Apr. 28, 2006, Yang et al.
U.S. Appl. No. 60/876,640, filed Dec. 22, 2006, Yang et al.
U.S. Appl. No. 60/295,577, filed Apr. 23, 2007, Cho et al.
U.S. Appl. No. 60/925,603, filed Apr. 23, 2007, Kim et al.
U.S. Appl. No. 60/969,127, filed Aug. 30, 2007, Liu et al.
U.S. Appl. No. 60/969,131, filed Aug. 30, 2007, Liu et al.
U.S. Appl. No. 60/012,416, filed Dec. 7, 2007, Kim et al.
U.S. Appl. No. 61/041,164, filed Mar. 31, 2008, Kim et al.
Armstrong, J. Abstract for "Peak-to-Average Power Reduction for OFDM by Repeated Clipping and Frequency Domain Filtering" IEEE Electronics Letters; vol. 38, Issue 5; Feb. 2002.
Bernardini, A, et al. "Analysis of Different Optimization Criteria for IF Predistortion in Digital Radio Links with Nonlinear Amplifiers" IEEE Transactions on Communications; vol. 45, Issue 4; Apr. 1997.
Cavers, J.K. "Adaptive Behaviour of a Feedforward Amplifer Linearizer" IEEE Transactions on Vehicular Technology; vol. 44, No. 1; Feb. 1995.
Cavers, J.K. "Amplifier Linearization Using Digital Predistorter with Fast Adaptation and Low Memory Requirements" IEEE Transactions on Vehicular Technology; vol. 39, Issue 4; Nov. 1990.
Ding, Lei et al. "A Hammerstein Predistortion Linearization Design Based on the Indirect Learning Architecture" IEEE Int'l Conf. on Acoustics, Speech, and Signal Processing, vol. 3; 2002.
Ding, Lei "Digital Predistortion of Power Amplifiers for Wireless Applications" School of Electrical and Computer Engineering Georgia Institute of Technology; Mar. 2004.
Eun, Changsoo et al. "A New Volterra Predistorter Based on the Indirect Learning Architecture" IEEE Transactions on Signal Processing, vol. 45, No. 1, Jan. 1997.
Falukner, M., et al. "Adaptive Linearization Using Predistortion—Experimental Results" IEEE Transactions on Vehicular Technology; vol. 43, Issue 2; May 1994.
Hilborn, Derek S. et al. "An Adaptive Direct Conversion Transmitter" IEEE Transactions on Vehicular Technology; vol. 43, No. 2, May 1994.
Kim, W.J., et al. "Baseband Derived RF Digital Predistortion" Electronic Letters; Vo. 42, No. 8; Apr. 13, 2006.
Kim, Wan-Jong "Digital Predistortion Linearization and Crest Factor Reduction for Wideband Applications" 2006.
Kim, Wan-Jong et al. "Digital Predistortion Linearizes Wireless Power Amplifiers" IEEE Microwave Magazine, vol. 6, Issue 3, Sep. 2005.
Kim, Wan-Jong et al. Abstract for "Digital Predistortion of a Doherty Amplifier With a Weak Memory within a Connected Solution" IEEE 60th Vehicular Technology Conference, vol. 3, Sep. 2004.
Kim, Wan-Jong, et al. "Piecewise Pre-Equalized Linearization of the Wireless Transmitter with a Dohery Amplifier" IEEE Transactions on Microwave Theory and Techniques; vol. 54, No. 9; Sep. 2006.
Leung, S.H., et al. Abstract for "Algorithm for Repeated Clipping and Filtering in Peak-to-Average Power Reduction for OFDM" IEEE Electronic Letters; vol. 38; Issue 25; Dec. 5, 2002.
Nagata. Y. et al. "Linear Amplification Technique for Digital Mobile Communications" IEEE 39th Vehicular Technology Conference; May 1989.
Santella, G "Performance of Adaptive Predistorters in Presence of Othogonal Multicarrier Modulation" International Conference on Telecommunications, Apr. 1997.
Stapleton, Shawn et al. "An Adaptive Predistorter for a Power Amplifier Based on Adjacent Channel Emissions" IEEE Transactions on Vehicular Technology; vol. 41, Issue 1; Feb. 1992.
Väänänen, Olli et al. "Effect of Clipping in Wideband CDMA System and Simple Algorithm for Peak Windowing" World Wireless Congress, San Francisco; May 2002.
Yang, Y., et al. Abstract for "A Fully Matched N-Way Doherty Amplifier with Optimized Linearity" IEEE Trans. Microwave Theory Tech., vol. 51, No. 3; Mar. 2005.
International Search Report for International Application No. PCT/US2007/010566, dated Apr. 18, 2008.
Written Opinion for International Application No. PCT/US2007/010566, dated Apr. 18, 2008.
International Preliminary Report on Patentability for International Application No. PCT/US2007/010566, dated Oct. 28, 2008.
First Office Action (Including Translation) for Chinese Application No. 200780023875.1, dated Dec. 23, 2011.
Second Office Action (Including Translation) for Chinese Application No. 200780023875.1, dated Oct. 16, 2012.
European Search Report for European Patent Application No. 07861302.3, dated Nov. 25, 2009.
International Search Report for International Application No. PCT/US2008/061355, dated Aug. 4, 2008.
Written Opinion for International Application No. PCT/US2008/061355, dated Aug. 4, 2008.
International Preliminary Report on Patentability for International Application No. PCT/US2008/061355, dated Oct. 27, 2009.
First Office Action (Including Translation) for Chinese Application No. 200880021049.8, dated Mar. 28, 2012.
Second Office Action (Including Translation) for Chinese Application No. 200880021049.8, dated Dec. 4, 2012.

(56) References Cited

OTHER PUBLICATIONS

Third Office Action (Including Translation) for Chinese Application No. 200880021049.8, dated Jun. 20, 2013.
European Search Report for European Application No. 08746721.3, dated Apr. 9, 2014.
Intention to Grant for European Application No. 08746721.3, dated Mar. 5, 2018.
Examination Report for Indian Patent Application No. 7544/DELNP/2009, dated Apr. 3, 2017.
Intent to Grant for Indian Patent Application No. 7544/DELNP/2009, dated Feb. 3, 2020.
Notice of Reasons for Rejection (Including Translation) for Japanese Patent Application No. 2010-506483, dated Jan. 10, 2012.
Notice of Reasons for Rejection (Including Translation) for Japanese Patent Application No. 2010-506483, dated Oct. 9, 2012.
Dismissal Decision for Amendment (Including Translation) for Rejection for Japanese Patent Application No. 2010-506483, dated Jun. 4, 2013.
Final Notice of Reasons for Rejection (Including Translation) for Japanese Patent Application No. 2010-506483, dated Dec. 17, 2013.
Decision to Grant (Including Translation) for Japanese Patent Application No. 2010-506483, dated Jul. 1, 2014.
Notification of Reason for Refusal (Including Translation) for Korean Application No. 10-2009-7024361, dated Apr. 29, 2014.
Grant of Patent (Including Translation) for Korean Application No. 10-2009-7024361, dated Dec. 22, 2014.
Notification of Reason for Refusal (Including Translation) for Korean Application No. 10-2014-7021366, dated Sep. 30, 2014.
Notification of Reason for Refusal (Including Translation) for Korean Application No. 10-2014-7021366, dated Jun. 28, 2015.
Notification of Reason for Refusal (Including Translation) for Korean Application No. 10-2014-7021366, dated Jan. 7, 2016.
Notice of Allowance (Including Translation) for Korean Application No. 10-2014-7021366, dated Sep. 27, 2016.
International Search Report for International Application No. PCT/IB2008/000996, dated Feb. 26, 2009.
Written Opinion for International Application No. PCT/IB2008/000996, dated Feb. 26, 2009.
International Preliminary Report on Patentability for International Application No. PCT/IB2008/00996, dated Jul. 28, 2009.
First Office Action (Including Translation) for Chinese Application No. 200880003130.3, dated Aug. 5, 2011.
Second Office Action (Including Translation) for Chinese Application No. 200880003130.3, dated May 3, 2012.
Third Office Action (Including Translation) for Chinese Application No. 200880003130.3, dated Jan. 11, 2013.
Fourth Office Action (Including Translation) for Chinese Application No. 200880003130.3, dated Jul. 8, 2013.
Fifth Office Action (Including Translation) for Chinese Application No. 200880003130.3, dated Dec. 24, 2013.
First Office Action (Including Translation) for Chinese Application No. 201410199319.1, dated Jul. 4, 2016.
Second Office Action (Including Translation) for Chinese Application No. 201410199319.1, dated May 18, 2017.
Third Office Action (Including Translation) for Chinese Application No. 201410199319.1, dated Jan. 31, 2018.
Notification to Grant Patent Right for Invention (including Translation) for Chinese Application No. 201410199319.1, dated Jul. 5, 2018.
European Search Report for European Application No. 08806836.6, dated Dec. 30, 2009.
International Search Report for International Application No. PCT/IB2007/004404, dated Sep. 19, 2008.
Written Opinion for International Application No. PCT/IB2007/004404, dated Sep. 19, 2008.
International Preliminary Report on Patentability for International Application No. PCT/IB2007/004404, dated Feb. 1, 2011.
First Office Action (Including Translation) for Chinese Application No. 201410462933.2, dated Dec. 16, 2016.
Second Office Action (Including Translation) for Chinese Application No. 201410462933.2, dated Aug. 30, 2017.
Third Office Action for Chinese Application No. 201410462933.2, dated Apr. 17, 2018.
Rejection Decision for Chinese Application No. 201410462933.2, dated Mar. 15, 2019.
First Board Opinion for Chinese Application No. 201410462933.2, dated Oct. 30, 2019.
Second Board Opinion (Including Translation) for Chinese Application No. 201410462933.2, dated Apr. 27, 2020.
European Search Report for European Application No. 07870441.8, dated Feb. 26, 2014.
Intent to Grant for European Application No. 07870441.8, dated Mar. 1, 2018.
European Search Report for European Application No. 18187871.1, dated Oct. 12, 2018.
Intention to Grant for European Application No. 18187871.1, dated Apr. 29, 2020.
Examination Report for Indian Patent Application No. 4344/CHENP/2009, dated Jul. 14, 2014.
Notice of Grant for Indian Patent Application No. 4344/CHENP/2009, dated Jun. 5, 2017.
Notice of Reasons for Refusal for (Including Translation) Japanese Patent Application No. 2009-543544, dated May 8, 2012.
Notice of Reasons for Refusal (Including Translation) for Japanese Patent Application No. 2009-543544, dated Aug. 21, 2012.
Notice of Reasons for Refusal (Including Translation) for Japanese Patent Application No. 2009-543544, dated Nov. 13, 2012.
Notice of Allowance (Including Translation) for Japanese Patent Application No. 2009-543544, dated Mar. 12, 2013.
Notification of Reason for Refusal (Including Translation) for Korean Application No. 10-2009-7015697, dated Apr. 28, 2014.
Notification of Reason for Refusal (Including Translation) for Korean Application No. 10-2009-7015697, dated Oct. 17, 2014.
Notification of Reason for Refusal (Including Translation) for Korean Application No. 10-2009-7015697, dated May 22, 2015.
Notification of Final Rejection (Including Translation) for Korean Application No. 10-2009-7015697, dated Jul. 27, 2015.
Notification of Reason for Refusal (Including Translation) for Korean Application No. 10-2014-7017682, dated Aug. 26, 2014.
Notification of Final Rejection (Including Translation) for Korean Application No. 10-2014-7017682, dated May 28, 2015.
International Search Report for International Application No. PCT/IB2008/003944, dated Sep. 18, 2009.
Written Opinion for International Application No. PCT/IB2008/003944, dated Sep. 18, 2009.
International Preliminary Report on Patentability for International Application No. PCT/IB2008/003944, dated Mar. 22, 2011.
First Office Action (Including Translation) for Chinese Patent Application No. 2008801263242, dated May 29, 2013.
Second Office Action (including Translation) for Chinese Patent Application No. 2008801263242, dated Apr. 11, 2014.
Notification to Grant Patent Right for Invention (Including Translation) Chinese Patent Application No. 200880126324.2, dated Aug. 10, 2016.
European Search Report for European Application No. 08873193.0, dated Apr. 29. 2014.
Office Action for European Application No. 08873193.0, dated Feb. 28, 2018.
Office Action for European Application No. 08873193.0, dated Dec. 12, 2018.
Examination Report for Indian Patent Application No. 4196/CHENP/2010, dated Sep. 26, 2017.
Decision on Hearing for Indian Patent Application No. 4196/CHENP/2010, dated Dec. 26, 2019.
Notice of Reasons for Refusal (Including Translation) for Japanese Patent Application No. 2010-536550, dated Aug. 7, 2012.
Decision to Grant a Patent (Including Translation) for Japanese Patent Application No. 2010-536550, dated Apr. 2, 2013.
Notification of Reason for Refusal (Including Translation) for Korean Application No. 10-2010-7015019, dated Oct. 24, 2014.
Notification of Reason for Refusal (Including Translation) for Korean Application No. 10-2010-7015019, dated May 26, 2015.

(56) References Cited

OTHER PUBLICATIONS

Notice of Allowance (Including Translation) for Korean Application No. 10-2010-7015019, dated Jan. 21, 2016.
International Search Report for International Application No. PCT/US2010/032453, dated Jun. 28, 2010.
Written Opinion for International Application No. PCT/US2010/032453, dated Jun. 28, 2010.
International Preliminary Report on Patentability for International Application No. PCT/US2010/032453, dated Nov. 3, 2011.
First Office Action (Including Translation) for Chinese Application No. 201080025887.X, dated Nov. 22, 2013.
Second Office Action (including Translation) for Chinese Application No. 201080025887.X, dated May 29, 2014.
Third Office Action (Including Translation) for Chinese Application No. 201080025887.X, dated Dec. 2, 2014.
Fourth Office Action (Including Translation) for Chinese Application No. 201080025887.X, dated Jun. 2, 2015.
Notification to Grant Patent Right for Invention (Including Translation) for Chinese Application No. 201080025887.X, dated Nov. 17, 2015.
European Search Report for European Application No. 10767899.7, dated Mar. 14, 2013.
Office Action for European Application No. 10767899.7, dated Jun. 2, 2015.
Office Action for European Application No. 10767899.7, dated Feb. 5, 2018.
Intention to Grant for European Application No. 10767899.7, dated Dec. 6, 2018.
Intention to Grant for European Application No. 10767899.7, dated Jun. 27, 2019.
Substantive Examination Report for Indonesian Application No. W00201201448, dated Sep. 2, 2016.
Examination Report for Indian Patent Application No. 8527/CHENP/2011, dated Nov. 28, 2019.
Notice of Reasons for Rejection (Including Translation) for Japanese Patent Application No. 2012-507473, dated Feb. 25, 2014.
Notice of Reasons for Rejection (Including Translation) for Japanese Patent Application No. 2012-507473, dated Dec. 2, 2014.
Decision of Refusal (Including Translation) for Japanese Patent Application No. 2012-507473, dated May 12, 2015.
Notice of Reasons for Rejection (Including Translation) for Japanese Patent Application No. 2015-178686, dated Sep. 27, 2016.
Decision of Refusal (Including Translation)for Japanese Patent Application No. 2015-178686, dated Aug. 28, 2017.
Notice of Reasons for Rejection (Including Translation) for Japanese Patent Application No. 2017-253609, dated Mar. 8, 2019.
Decision of Refusal (Including Translation) for Japanese Patent Application No. 2017-253609, dated Nov. 5, 2019.
Notification of Reasons for Refusal (Including Translation) for Korean Application No. 10-2011-7027891, dated Jul. 14, 2016.
Notification of Reasons for Refusal (including Translation) for Korean Application No. 10-2011-7027891, dated Apr. 21, 2017.
Notification of Reasons for Refusal (Including Translation) for Korean Application No. 10-2011-7027891, dated Feb. 26, 2018.
Notification of Reasons for Refusal (including Translation) for Korean Application No. 10-2011-7027891, dated Oct. 4, 2018.
Notice of Allowance (Including Translation) for Korean Application No. 10-2011-7027891, dated Jan. 4, 2019.
Office Action for U.S. Appl. No. 10/137,556, dated Dec. 2, 2004.
Notice of Allowance for U.S. Appl. No. 10/137,556, dated Jul. 6, 2005.
Office Action for U.S. Appl. No. 11/262,079 dated Aug. 29, 2008.
Office Action for U.S. Appl. No. 11/262,079 dated May 4, 2009.
Office Action for U.S. Appl. No. 11/262,079 dated Dec. 11, 2009.
Office Action for U.S. Appl. No. 11/262,079 dated Aug. 25, 2010.
Office Action for U.S. Appl. No. 11/262,079 dated Mar. 26, 2012.
Notice of Allowance for U.S. Appl. No. 11/262,079 dated Aug. 23, 2012.
Office Action for U.S. Appl. No. 13/619,538, dated Sep. 18, 2013.
Notice of Allowance for U.S. Appl. No. 13/619,538, dated Dec. 31, 2013.
Office Action for U.S. Appl. No. 14/245,190, dated Aug. 18, 2014.
Notice of Allowance for U.S. Appl. No. 14/245,190, dated Jan. 14, 2015.
Office Action for U.S. Appl. No. 14/684,678, dated Aug. 28, 2015.
Notice of Allowance for U.S. Appl. No. 14/684,678, dated Feb. 22, 2016.
Office Action for U.S. Appl. No. 15/173,887, dated Dec. 2, 2016.
Office Action for U.S. Appl. No. 15/173,887, dated Aug. 7, 2017.
Office Action for U.S. Appl. No. 15/173,887, dated Jan. 24, 2018.
Office Action for U.S. Appl. No. 15/173,887, dated Jul. 26, 2018.
Office Action for U.S. Appl. No. 16/230,750, dated Sep. 20, 2019.
Office Action for U.S. Appl. No. 16/230,750, dated Jun. 8, 2020.
Office Action for U.S. Appl. No. 11/799,239, dated Oct. 29, 2009.
Office Action for U.S. Appl. No. 11/799,239, dated Jun. 24, 2010.
Notice of Allowance for U.S. Appl. No. 11/799,239, dated Sep. 22, 2011.
Office Action for U.S. Appl. No. 13/301,224, dated May 24, 2012.
Office Action for U.S. Appl. No. 13/301,224, dated Oct. 25, 2012.
Office Action for U.S. Appl. No. 13/301,224, dated Apr. 2, 2013.
Notice of Allowance for U.S. Appl. No. 13/301,224, dated Aug. 30, 2013.
Office Action for U.S. Appl. No. 14/095,891, dated Jun. 10, 2014.
Notice of Allowance for U.S. Appl. No. 14/095,891, dated Jan. 21, 2015.
Office Action for U.S. Appl. No. 14/691,152, dated Apr. 25, 2016.
Notice of Allowance for U.S. Appl. No. 14/691,152, dated Jan. 6, 2017.
Notice of Allowance for U.S. Appl. No. 14/691,152, dated Apr. 19, 2017.
Office Action for U.S. Appl. No. 15/682,431, dated Mar. 12, 2018.
Notice of Allowance for U.S. Appl. No. 15/682,431, dated Jan. 18, 2019.
Office Action for U.S. Appl. No. 16/388,680, dated Jan. 27, 2020.
Office Action for U.S. Appl. No. 16/388,680, dated Jun. 9, 2020.
Office Action for U.S. Appl. No. 12/021,241, dated Apr. 15, 2009.
Office Action for U.S. Appl. No. 12/021,241, dated Dec. 18, 2009.
Office Action for U.S. Appl. No. 12/021,241, dated Sep. 21, 2010.
Office Action for U.S. Appl. No. 12/021,241, dated Feb. 15, 2012.
Notice of Allowance for U.S. Appl. No. 12/021,241, dated Sep. 25, 2012.
Office Action for U.S. Appl. No. 13/724,157, dated Oct. 10, 2014.
Notice of Allowance for U.S. Appl. No. 13/724,157, dated Mar. 10, 2015.
Office Action for U.S. Appl. No. 14/788,567, dated Dec. 3, 2015.
Office Action for U.S. Appl. No. 14/788,567, dated Jun. 3, 2016.
Office Action for U.S. Appl. No. 14/788,567, dated Nov. 22, 2016.
Office Action for U.S. Appl. No. 14/788,567, dated May 31, 2017.
Office Action for U.S. Appl. No. 14/788,567, dated Nov. 9, 2017.
Notice of Allowance for U.S. Appl. No. 14/788,567, dated May 31, 2018.
Office Action for U.S. Appl. No. 16/118,329, dated Mar. 28, 2019.
Office Action for U.S. Appl. No. 16/118,329, dated Oct. 10, 2019.
Notice of Allowance for U.S. Appl. No. 16/118,329, dated Feb. 18, 2020.
Office Action for U.S. Appl. No. 12/108,502 dated Jul. 23, 2009.
Office Action for U.S. Appl. No. 12/108,502 dated Apr. 14, 2010.
Office Action for U.S. Appl. No. 12/108,502 dated Dec. 29, 2010.
Office Action for U.S. Appl. No. 12/108,502 dated Sep. 23, 2011.
Notice of Allowance for U.S. Appl. No. 12/108,502 dated Feb. 6, 2014.
Notice of Allowance for U.S. Appl. No. 12/108,502 dated Jul. 18, 2014.
Office Action for U.S. Appl. No. 14/271,881, dated Jul. 28, 2016.
Notice of Allowance for U.S. Appl. No. 14/271,881, dated Apr. 27, 2017.
Office Action for U.S. Appl. No. 15/684,580, dated Apr. 3, 2019.
Office Action for U.S. Appl. No. 12/767,669, dated Aug. 4, 2011.
Office Action for U.S. Appl. No. 12/767,669, dated Jan. 30, 2012.
Office Action for U.S. Appl. No. 12/767,669, dated Oct. 12, 2012.
Office Action for U.S. Appl. No. 12/767,669, dated May 9, 2013.
Office Action for U.S. Appl. No. 12/767,669, dated Oct. 29, 2013.

(56) References Cited

OTHER PUBLICATIONS

Office Action for U.S. Appl. No. 12/767,669, dated May 23, 2014.
Notice of Allowance for U.S. Appl. No. 12/767,669, dated Jan. 5, 2015.
Office Action for U.S. Appl. No. 11/962,025, dated Jul. 9, 2010.
Office Action for U.S. Appl. No. 11/962,025, dated Feb. 16, 2011.
Office Action for U.S. Appl. No. 11/962,025, dated May 24, 2012.
Office Action for U.S. Appl. No. 11/962,025, dated Sep. 28, 2012.
Notice of Allowance for U.S. Appl. No. 11/962,025, dated Feb. 8, 2013.
Mekechuk, Kelly et al. "Linearizing Power Amplifiers Using Digital Predistortion, EDA tools and Test Hardware" High Frequency Electronics; Apr. 2004.
Translation of First Office Action for Chinese Application No. 200780051434.2, dated Mar. 6, 2013.
Second Office Action (Including Translation) for Chinese Application No. 200780051434.2, dated Jan. 2, 2014.
Board Decision (Including Translation) for Chinese Application No. 201410462933.2, dated Sep. 28, 2020.
Notice of Allowance for U.S. Appl. No. 16/230,750, dated Dec. 14, 2020.
Office Action for U.S. Appl. No. 16/388,680, dated Oct. 30, 2020, 2020.
Office Action for U.S. Appl. No. 11/961,969, dated Sep. 23, 2010.
Office Action for U.S. Appl. No. 11/961,969, dated May 10, 2011.
Notice of Allowance for U.S. Appl. No. 11/961,969, dated Nov. 25, 2011.
Office Action for U.S. Appl. No. 13/404,679, dated Aug. 28, 2012.
Notice of Allowance for U.S. Appl. No. 13/404,679, dated Feb. 5, 2013.
Office Action for U.S. Appl. No. 13/887,133, dated Nov. 7, 2013.
Notice of Allowance for U.S. Appl. No. 13/887,133, dated Jun. 6, 2014.
Office Action for U.S. Appl. No. 14/480,285, dated Jan. 30, 2015.
Notice of Allowance for U.S. Appl. No. 14/480,285, dated Sep. 16, 2015.
Office Action for U.S. Appl. No. 14/991,264 dated Jun. 30, 2016.
Office Action for U.S. Appl. No. 14/991,264 dated Apr. 28, 2017.
Notice of Allowance for U.S. Appl. No. 14/991,264 dated Oct. 19, 2017.
Office Action for U.S. Appl. No. 15/875,936 dated Oct. 5, 2018.
Office Action for U.S. Appl. No. 15/875,936 dated Apr. 2, 2019.
Office Action for U.S. Appl. No. 16/777,306 dated Jun. 23, 2020.
U.S. Appl. No. 10/137,556, filed May 1, 2002 U.S. Pat. No. 6,985,704.
U.S. Appl. No. 11/262,079, filed Oct. 27, 2005 U.S. Pat. No. 8,326,238.
U.S. Appl. No. 13/619,538, filed Sep. 14, 2012 U.S. Pat. No. 8,731,495.
U.S. Appl. No. 14/245,190, filed Apr. 4, 2014 U.S. Pat. No. 9,031,521.
U.S. Appl. No. 14/684,678, filed Apr. 13, 2015 U.S. Pat. No. 9,374,196.
U.S. Appl. No. 15/173,887, filed Jun. 6, 2016.
U.S. Appl. No. 16/230,750, filed Dec. 21, 2018.
U.S. Appl. No. 11/799,239, filed Apr. 30, 2007 U.S. Pat. No. 8,064,850.
U.S. Appl. No. 13/301,224, filed Nov. 21, 2011 U.S. Pat. No. 8,620,234.
U.S. Appl. No. 14/095,891, filed Dec. 3, 2013 U.S. Pat. No. 9,054,758.
U.S. Appl. No. 14/691,152, filed Apr. 20, 2015 U.S. Pat. No. 9,742,446.
U.S. Appl. No. 15/682,431, filed Aug. 21, 2017 U.S. Pat. No. 10,305,521.
U.S. Appl. No. 16/388,680, filed Apr. 18, 2019.
U.S. Appl. No. 12/021,241, filed Jan. 28, 2008 U.S. Pat. No. 8,380,143.
U.S. Appl. No. 13/724,157, filed Dec. 21, 2012 U.S. Pat. No. 9,077,297.
U.S. Appl. No. 14/788,567, filed Jun. 30, 2015 U.S. Pat. No. 10,097,142.
U.S. Appl. No. 16/118,329, filed Aug. 30, 2018 U.S. Pat. No. 41,693,425.
U.S. Appl. No. 12/108,502, filed Apr. 23 2008 U.S. Pat. No. 8,811,917.
U.S. Appl. No. 14/271,881, filed May 7, 2014 U.S. Pat. No. 9,768,739.
U.S. Appl. No. 15/684,580, filed Aug. 21, 2017.
U.S. Appl. No. 16/592,615, filed Oct. 3, 2019.
U.S. Appl. No. 12/767,669, filed Apr. 26, 2010 U.S. Pat. No. 9,026,067.
U.S. Appl. No. 11/962,025, filed Dec. 20, 2007 U.S. Pat. No. 8,472,897.
U.S. Appl. No. 13/886,190, filed May 2, 2013.
Notice of Allowance received for U.S. Appl. No. 16/410,860, dated Jan. 7, 2021, 54 pages.
Lemson et al., U.S. Appl. No. 14/949,405, filed Nov. 23, 2015.
Lemson et al., U.S. Appl. No. 15/205,820, filed Jul. 8, 2016.
Bicsi, "Network Design Basics for Cabling Professionals", McGraw-Hill, New York, NY, USA, 2002, 393 pages.
Common Public Radio Interface (CPRI) Specification V1.4, dated Mar. 31, 2006, downloaded from http://www.cpri.info/spec.html on Mar. 28, 2017, 64 pages.
Common Public Radio Interface (CPRI) Specification V2.1, dated Mar. 31, 2006, downloaded from http://www.cpri.info/spec.html on Mar. 28, 2017, 76 pages.
Common Public Radio Interface (CPRI) Specification V3.0, dated Oct. 20, 2006, downloaded from http://www.cpri.info/spec.html on Mar. 28, 2017, 89 pages.
Common Public Radio Interface (CPRI) Specification V4.0, dated Jun. 30, 2008, downloaded from http://www.cpri.info/spec.html on Mar. 28, 2017, 96 pages.
Common Public Radio Interface (CPRI) Specification V4.1, dated Feb. 18, 2009, downloaded from http://www.cpri.info/spec.html on Mar. 28, 2017, 109 pages.
Grundmann et al., "An empriacal comparison of a distrubuted antenna microcell system versus a single antenna! microcell system for indooor spread spectrum communications at 1.8 GHz", ICUPC Conference, 1993, 5 pages.
Zhaohui et al., "A rake type receiver structure for CDMA mobile communication systems using antenna arrays", IEEE, 1996, pp. 528-530.
Mastering The Mix In Signal Processing, Mixed-Signal Design Seminar, 1991, Analog Devices, Inc., 3 pages.
Grace, Martin K., "Synchronous quantized subcarrier multiplexing for transport of video, voice, and data", IEEE Journal on Selected Areas in Communications, vol. 8, No. 7, Sep. 1990, pp. 1351-1358.
Wala, Philip M., "A new microcell architecture using digital optical transport", IEEE, 1993, pp. 585-588.
Crofut, Walter, "Remote monitoring of wirelss base stations Jun. 1, 1998", http://urgentcomm.com/prinUmag/remote-monitoring-wireless-base-stations, downloded on Mar. 13, 2017, 4 pages.
Cyr et al., "The digital age is here, Digital radio frequency transport enhances cellular network performance", Telephony, Jul. 4, 1993, pp. 20-24.
CityCell 824, "Remote Site Manual, How to use ii, Preliminary Version"; Feb. 1, 1993, 237 pages.
Cheun, Kyungwhoon, "Performance of direct-sequence spread-spectrum rake receives with randon spreading sequences", IEEE Transactions On Communication, vol. 45, No. 9, Sep. 9, 1997, pp. 1130-1143.
Brunner et al., "On space-lime rake receiver structure for WCDMA", 1999, IEEE, pp. 1546-1551.
Graf, Rudolf F., "Modem Dictionary of Electronics, 7th Ed.", 1999, Newnes publishing, 9 pages.
"Introduction to Receivers" Available at http://weww.ece.ucsb.eduHong/ece145a/lnlroduction_to_Receivers.pdf downloaded Jun. 15, 2017, 28 pages.
Pereira, Stephen M., "Standardizing Digital IF Data Transfer with VITA 49", RTC Magazine, downloaded Jun. 15, 2017 from http://rtcmagazine.com/articles/view/100460, 5 pages.

(56) References Cited

OTHER PUBLICATIONS

Lan et al., "GSM Co-Channel and Adjacent Channel Interference Analysis and Optimization", Tsinghua Science And Technology, ISSN 1007-0214 04/12, Dec. 2011, vol. 16, No. 5, pp. 583-588.
Petition for Inter Partes Review of U.S. Pat. No. 9,531,473 Under 35 U.S.C. §§ 311-319 and 37 C.F.R. § 41.100 ET SEQ., filed Feb. 2, 2018, 95 pages.
Acampora, Anthony, "Declaration of Dr. Anthony Acampora" in support of InlerPartes Review of U.S. Pat. No. 9.531,473, Feb. 2, 2018, 190 pages.
LaPlante, Phillip A., "Comprehensive Dictionary of Electrical Engineering" IEEE Press, CRC Press LLC, 1999, 4 pages.
Microsoft Press "Computer Dictionary: The Comprehensive Standard for Business, School, Library, and Home", 1991, Microsoft Press, ISBN 1-55615-231-0, 6 pages.
Miley Electrical and Electronics Engineering Dictionary, 2004, Wiley & Sons, Inc., 7 pages.
McGraw-Hill Dictionary of Scientific and Technical Terms, {5th ed.), 1994, McGraw-Hill, Inc., ISBN 0-07-042333-4, 6 pages.
Excerpts from Patent Owne?s Invalidity Contentions regarding U.S. Pat. No. 7,639,982 served in related matter *Comm Scope Technologies LLC* v. *Dali Wireless, Inc.*, Case No. 3:16-cv-00477-B (N.D. Tex.) ("Patent Owner's Invalidity Contentions Ex. C"), 410 pages, Dec. 9, 2009.
Horak, Ray, "Telecommunications and Data Communications Handbook", 2007, Wiley & Sons, Inc., 55 pages.
Spurgeon, Charles E., "Ethernet, The Definitive Guide", 2000, O'reilly & Assoc., Inc., 112 pages.
ADC Digivance "Street-Level Coverage Solution {SGS)" Aug. 2005, 8 pages.
ADC Digivance "Street-Level Coverage Solution System will1 Version 3.01 EMS Software Operation and Maintenance Manual" ADCP-75-187, Issue 1, Sep. 2005, 78 pages.
ADC Digivance "CXD Multi-Band Distributed Antenna System Installation and Operation Manual" ADCP-75-192; Preliminary Issue D; Oct. 2005, 122 pages.
ADC Digivance "Street-Level Coverage Solution 800 MHz, 1900 MHz, and 800i900 MHz SMR System Operation and Maintenance Manual" ADCP-75-187; Preliminary Issue 18; Nov. 2005, 88 pages.
ADC Digivance "CXD Multi-Band Distributed Antenna System Operation Manual" ADCP-75-192; Issue 1, Dec. 2005, 130 pages.
ADC Digivance "Indoor Coverage Solution 800 MHz Single- or Multi-Mode Fiber System Installation and Operation Manual", ADC-75-130; Preliminary Issue 3C; Aug. 2006, 78 pages.
ADC Digivance "NXS Radio Access Node {RAN) Installation and Maintenance Manual" ADCP-75-210; Issue 1; Nov. 2006, 84 pages.
ADC FlexWave Prism Element Management System 6.0 User Manual; ADCP-77-152; Issue 1; Mar. 2010, 308 pages.
ADC FlexWave Prism Element Management System 7.1 User Manual; ADCP-77-177; Issue 1; Jul. 2011, 350 pages.
ADC FlexWave Prism 6.0; Troubleshooting Guide; ADCP-77-074; Issue 1; Oct. 2010, 62 pages.
ADC FlexWave Prism Remote RF Module Installation Instructions; ADCP-77-079; Issue 2; Mar. 2010, 30 pages.
ADC FlexWave Prism Remote RF Module Installation Instructions; ADCP-77-079; Issue 3; Jul. 2011, 32 pages.
ADC FlexWave Prism Remote 40W RF Module Installation Instructions; ADCP-77-162; Issue 1; Mar. 2010, 26 pages.
ADC FlexWave Prism Remote Unit Installation Guide; ADCP-77-072; Issue 4; Jul. 2011, 44 pages.
ADC FlexWave Prism Remote Unit Installation Guide; ADCP-77-072; Issue 5; Nov. 2011, 44 pages.
ADC FlexWave Prism "Flexible Outdoor Wireless Coverage Capacity", 106969AE, Oct. 2008, 8 pages.
ADC FlexWave Prism Host, Remote and EMS 5.1 "System Reference" ADCP-77-073: Issue 2; Nov. 2009, 364 pages.
ADC FlexWave URH Operation and Maintenance Manual— Preliminary, 2007, 7 pages.
ADC FlexWave Universal Radio Head (URH) Radio Head (URH) Host Unit "Installation Instructions" ADCP-75-34 7; Issue 1; Apr. 2008, 32 pages.
ADC FlexWave Universal Radio Head (URH) Radio Head (URH) Host Unit "Installation Instructions" ADCP-75-348; Issue 1; Apr. 2008, 44 pages.
ADC FlexWave User Manual "FlexWave Web-Based Element Management System; EMS for Universal Radio Head System" ADCP-75-352; Aug. 2008, 160 pages.
Das et al., "A Dynamic Load balancing Strategy for Channel Assignment Using Selective Borrowing in Cellulary Mobile Environment", Wireless Networks, vol. 3,1997, 15 pages.
ETSI TS 125 101 V.3.11.0 "Universal Mobile Telecommunications System", (UMTS); UE Radio Transmission and Reception (FDD) (3GPP TS 25.101 Version 3.11.0 Release Jun. 2002,1999, 69 pages.
ETSI TS 125 423 V5.6.0 "Universal Mobile Telecommunications System (UMTS); UTRAN lur Interface Radio Network Subsystem Application Part (RNSAP) Signaling (3GPP TS 25.423 version 5.6.0 Release 5)" Jun. 2003, 559 pages.
Hollis et al., "The Theory of Digital Down Conversion", Hunt Engineering, Jun. 26, 2003, 6 pages.
Information Sciences Institute, University of Southern California "DOD Standard Internet Protocol" RFC 760; Jan. 1980, 46 pages.
Information Sciences Institute, University of Southern California "Internet Protocol; DARPA Internet Program; Protocol Specification" RFC 791; Sep. 1981, 49 pages.
OBSAI "Open Base Station Architecture Initiative: BTS System Reference Document" Version 2.0; Apr. 27, 2006, 151 pages.
OBSAI "Open Base Station Architecture Initiative: Reference Point 3 Specification" Version 3.1; Nov. 13, 2006, 116 pages.
OBSAI "Open Base Station Architecture Initiative: Reference Point 3 Specification" Version 4.1; Jul. 14, 2008, 144 pages.
Notice of Allowance received for U.S. Appl. No. 17/000,188, dated Jan. 19, 2021, 103 pages.
Final Office Action received for U.S. Appl. No. 16/406,252, dated Feb. 5, 2021, 20 pages.
Non-Final Office Action received for U.S. Appl. No. 16/592,615, dated Feb. 3, 2021, 59 pages.
Final Office Action received for U.S. Appl. No. 16/737,419, dated Mar. 11, 2021, 41 pages.
Notice of Allowance received for U.S. Appl. No. 16/777,306, dated Jan. 25, 2021, 49 pages.
Extended European Search Report for application No. 20196761.9 dated Dec. 23, 2020.
Notice of Allowance received for U.S. Appl. No. 16/777,306, dated May 17, 2021, 24 pages.
Notice of Allowance received for U.S. Appl. No. 17/000,188 dated Nov. 25, 2020, 13 pages.
Notice of Allowance received for U.S. Appl. No. 16/944,028, dated Apr. 7, 2021, 31 pages.

\* cited by examiner

FIGURE 1  The predistortion architecture

FIGURE 2 The combined time-delay lookup table for predistortion and time-delay compensation FIGURE 3 The combined time-delay lookup table for predistortion and time-delay compensation using parallel addressing

POWER AMPLIFIER TIME-DELAY INVARIANT PREDISTORTION METHODS AND APPARATUS

CROSS-REFERENCE TO RELATED APPLICATIONS

This application is a continuation of U.S. patent application Ser. No. 16/118,329, file Aug. 30, 2018, now U.S. Pat. No. 10,693,425, which is a continuation of U.S. patent application Ser. No. 14/788,567, filed Jun. 30, 2015, now U.S. Pat. No. 10,097,142, which is a continuation application of U.S. patent application Ser. No. 13/724,157, filed Dec. 21, 2012, now U.S. Pat. No. 9,077,297, which is a continuation of U.S. patent application Ser. No. 12/021,241, filed Jan. 28, 2008, now U.S. Pat. No. 8,380,143, which is a continuation-in-part of U.S. patent application Ser. No. 11/262,079, filed Oct. 27, 2005, now U.S. Pat. No. 8,326,238, which is a continuation of U.S. application Ser. No. 10/137,556, filed May 1, 2002, now U.S. Pat. No. 6,985,704. U.S. patent application Ser. No. 12/021,241 also claims the benefit of U.S. Provisional Patent Application No. 60/897,746, filed Jan. 26, 2007, each of which are incorporated by reference in their entirety for all purposes. This application also incorporates by reference U.S. patent application Ser. No. 11/799,239, filed Apr. 30, 2007 and its parent U.S. Provisional Patent Application No. 60/795,820, filed Apr. 28, 2006, titled "High Efficiency Linearization Power Amplifier For Wireless Communication"; related non provisional U.S. patent application Ser. No. 11/962,025, filed Dec. 20, 2007, titled "Power Amplifier Predistortion Methods and Apparatus;" and its parent U.S. Provisional Patent Application No. 60/876,640, filed Dec. 22, 2006, titled "Power Amplifier Predistortion Methods and Apparatus."

FIELD OF THE INVENTION

The present invention relates systems and methods for using predistortion to linearize the output of a power amplifier (PA), such as those used in wireless transmission systems. More particularly, the present invention uses an adaptive time-delay adjusting methodology to correct the PA's nonlinearity. More particularly, the invention relates to systems and methods which use a time-delay invariant predistortion architecture to linearize the output of a power amplifier (PA) in wireless transmission systems.

BACKGROUND OF THE INVENTION

In a typical prior art predistortion system for the linearization of power amplifiers, the system typically contains multiple signal transmission paths, such as a reference path and a feedback path. In a predistortion linearization system, when a signal passes through different signal transmission paths, such as a reference path and a feedback path, the occurrence of a timing difference caused by the distinct signal paths is inevitable. This difference, usually referred to as a time delay, presents significant problems with respect to the accuracy of the predistortion correction. These problems are made worse by the fact that the time delay can vary with environmental conditions including temperature, system conditions including signal power level, system aging, and so on. Therefore, it is difficult to measure in a laboratory such an intrinsic time delay parameter, and, moreover, a parameter for correcting the time-delay cannot be designed as a constant. Many efforts have been made in the prior art to compensate for, reduce or eliminate this time-delay.

Traditionally, two methods have been used in prior art predistortion circuits to solve the problem created by the time-delay.

The first is to make a special time-delay cable by measuring and calculating the difference of the same signal passing through different transmission paths so as to compensate the time-delay effect, such as the processing in analog feed-forward predistortion systems. This approach suffers the limitation that the time-delay cable imposes a fixed time-delay that cannot be adjusted despite changes in the signal and environment which naturally occur during the operation of practical systems.

The second is to use a special digital signal processing (DSP) algorithm and circuitry to calculate and adjust adaptively the time difference of the same signal passing through different transmission paths, and then use the resulting time-delay information to correct the non-linearity of power amplifier. This approach is usually implemented in a digital feedback approach and a wireless environment. However, an extra circuit, typically a latch, and an associated algorithm are needed, and the accuracy of the time-delay calculation is also related to the convergence rate of the algorithm.

SUMMARY OF THE INVENTION

Next-generation wireless communication systems will demand improved transmitted signal quality and improved overall RF transmitter system performance for a variety of broadband and multimedia services. These demands upon advanced RF transmitter systems will be satisfied, at least in part, by power amplifiers with higher power efficiency and higher spectrum efficiency than is currently available. In order to get a better predistortion result, the present invention evaluates the time-delay parameter as a variable that is estimated and calculated by a special algorithm and circuitry.

More particularly, the present invention uses, in one implementation, one combined predistortion and time-delay lookup table structure to provide correction factors for both the PA's non-linear distortion and the system's time-delay. This permits the system and method of the present invention to be a self-calibrating solution for performance improvement and nonlinear correction in wireless RF transmitter systems.

This design can be conveniently implemented by an elegantly simple circuit structure and can be used for almost all wireless radio frequency (RF) transmission systems to improve both power efficiency and spectrum efficiency. Examples of some applicable RF transmission systems include wireless base-stations, access points, mobile handsets including but not limited to cellular and GPRS protocols, mobile wireless terminals, portable wireless devices, and other wireless communication systems such as microwave and satellite communications.

The new time-delay invariant method presented herein uses a combination of (i) an adaptive time-delay adjusting methodology to process the PA's nonlinearity, and, at the same time, (ii) time-delay compensation without the additional circuitry and/or an algorithm tailored for the special time-delay adjustment. This novel algorithm-based methodology can be implemented by a predistortion processing unit that includes a time-delay addressing lookup table that can store and memorize the PA's non-linearity, time-delay information and other interference in the system such as noise.

These and other features of the present invention can be better appreciated from the following detailed description, taken in conjunction with the accompanying Figures.

DETAILED DESCRIPTION OF THE INVENTION

In one implementation of the invention, the entries for the lookup table are developed in accordance with the techniques described in pending U.S. patent application Ser. No. 11/262,079, filed Oct. 27, 2005, and U.S. patent application Ser. No. 11/799,239, filed Apr. 30, 2007, both of which are incorporated herein by reference. It will be appreciated by those skilled in the art that the range of errors which occur in a real-world system are bounded; that is, there is a range which has a minimum value and a maximum value, and in all but rare circumstances the correction factor applicable at the time of any given sample will fall within that range. By selecting a lookup table of appropriate size, and populating the lookup table with appropriate values as determined by the methods in the above-mentioned patent, which are selected over the entire operating spectrum of the PA and associated system, the correction factor which is appropriate for each sampling of the input signal will be one of the values already in the lookup table. Thus, once the lookup table has been fully populated, the correction factors of the present invention do not vary with time; that is, they are time-invariant. Although the size of the lookup table can vary significantly with the particular implementation, and could for some systems be as small as sixteen entries, for more complex implementations such as those appropriate for wireless RF transmission systems the table will have on the order of $2^{12}$ entries or more, and may have significantly more entries depending on the permissible power consumption, cost, and related system factors. For certain implementations, a table size between $2^{12}$ and $2^{14}$ entries has been found to be acceptable.

In one implementation, the lookup table of the predistortion processing unit, or predistorter, is addressed by a set of time-related addresses that can be structured by a shift register, although parallel addressing may be implemented in some schemes, as discussed in greater detail hereinafter. For present purposes, the shift register technique will be used for illustration. The addressing of the lookup table is based upon a stored-compensation or memory compensation principle that stores information at different time by a vector form and maps the input vector into one of the entries in the lookup table. The set of addressed entries in the lookup table will result in an output signal that is a mapping function of the corresponding input vector. Due to the input address vector comprising different time signals, the output signal of the lookup table is actually related to the different time information, including the current signal and previous N transmitted signals, where N>1 and N is an integer. As a result, the signal stored in each entry of the lookup table can be considered as a combination of all past transmitted signals rather than the sole response of the current input signal. Typically, the bit length of the address vector in the lookup table determines the duration of time-delay signal to be covered.

In order to correct for the PA's non-linearity in the time-delay environment with a lookup table unit according to the invention, without the use of a latch or other secondary correction circuit, the predistortion algorithm utilizes a function to incorporate the time-delay signal combination. The lookup table stores the non-linear information derived from the PA together with a time-delay factor that is caused by the different signal transmission paths. By appropriately addressing the lookup table in response to a sample, the lookup table provides a correction factor which includes both the appropriate predistortion correction and the appropriate time delay compensation. The output of the lookup table is then combined with the original input signal to provide an input to the PA that results in a linearized output, with substantially no time delay error.

Due to the memory and store function of the lookup table, the non-linear characteristics of the PA that are to be corrected by the lookup table are not limited by the time-based data. The time-independent feature of the lookup table's adaptive processing is one benefit of at least some implementations of the addressing arrangement of the lookup table. The addressing of the lookup table is implemented by a set of N-bit vector data that comprises the current input signal as well as the previous N input signals. Therefore, the address of the lookup table is a combination of series of input sequences with the length of N. The longer the address of the lookup table (and therefore the larger the lookup table), the wider the range of time-delay information that the system can accommodate, i.e. the longer duration of time-delay effects that the system can tolerate. However, while a larger table may permit storage of more information, at some point the entries become repetitive, such that a larger table offers diminishing marginal returns, wastes memory resources, and unnecessarily increases power consumption.

The lookup table of the predistortion processor is based upon the stored-compensation principle that maps a set of input vectors to a real signal output. Since the address of lookup table contains the input information stored from different time, each output signal generated by the lookup table is closely related to the transmitted multi-signals combination. Therefore, based upon the arrangement of the lookup table, the table update entries are also closely related to the combination information of input signals stored from different time points.

Figure 1:
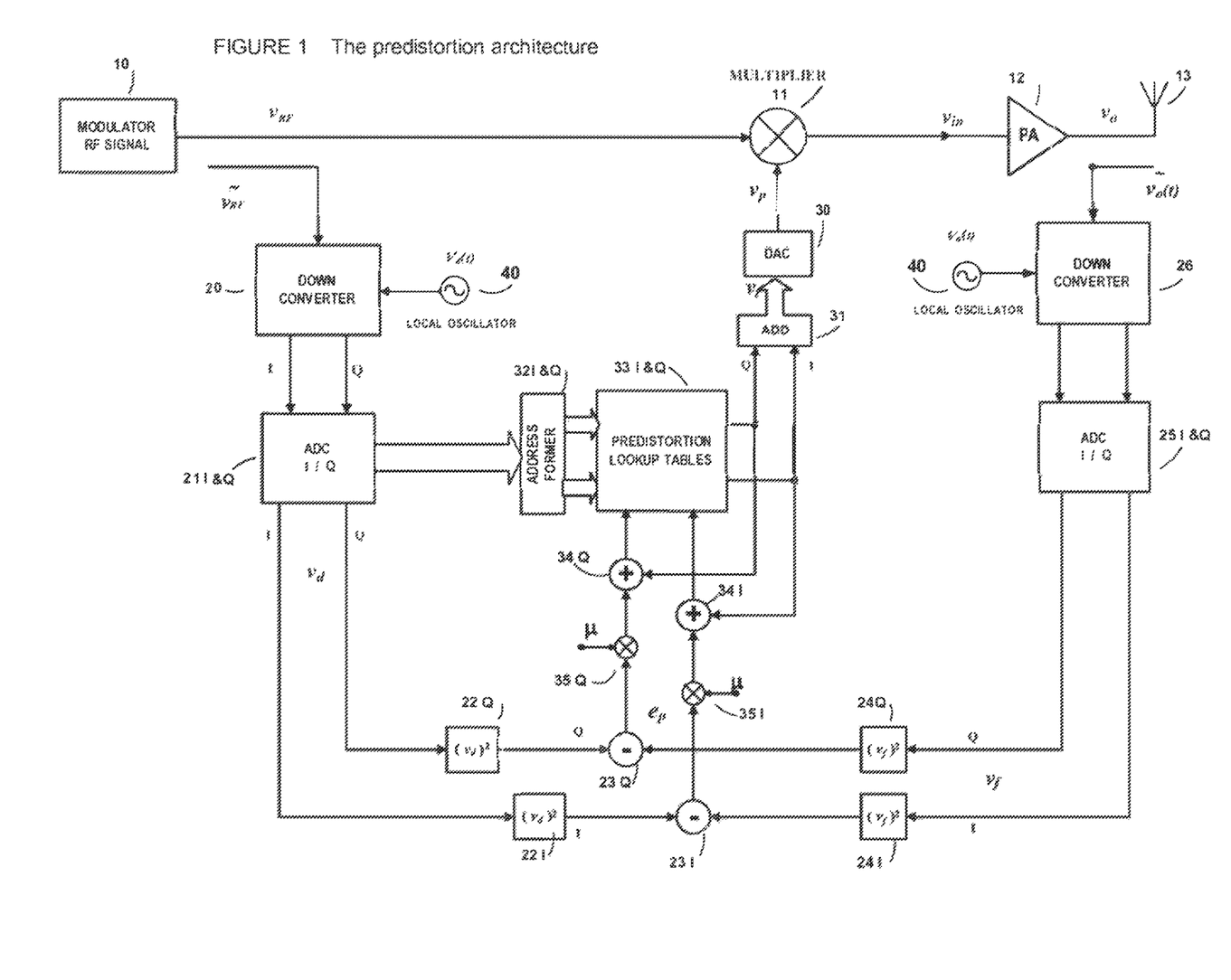
FIG. 1 illustrates a system and apparatus in accordance with the present invention.

Referring next to FIG. 1, an embodiment of the present invention may be appreciated in greater detail. More particularly, the illustrated embodiment includes an Analog Multiplier 11 which receives a modulated RF signal $V_{RF}$ from the RF modulator portion 10 of the base station, and also receives a predistortion correction signal Vp from a lookup table and related components which can be generally described as a predistortion processor, discussed in greater detail below. In general, the predistortion processor can be thought of as all of the components between the ADC's 21 and 25 and the DAC 30. The output of the analog multiplier 11 is provided as the input yin to the power amplifier (PA) 12, which in turn transmits an output signal $V_o$ to an Antenna 13. The RF modulator 10 is typically although not necessarily a quadrature modulator or an orthogonal modulator. It will be appreciated that multiplier 11 can be implemented as multiple multipliers, each associated with one or more quadrature signals.

An input down-converter circuit 20 receives an idealized reference signal $V_{RF}$ from modulator in base station, and is biased by a local oscillator 40, such that it provides an output $V_d$ to an analog-to-digital converter 21. The ADC 21 converts the signal $V_d$ to digital form (as I and Q signals), whereupon it is provided as one input pair to the Digital Predistortion Processor, and more specifically to variables 22I and 22Q, respectively.

A feedback down-converter circuit 26, also biased by a local oscillator 40, receives a raw feedback signal $V_o(t)$ from the output of the PA, and provides a feedback signal $V_f$ to an feedback ADC 25. The digital output of the ADC 25 then provides a second input, i.e. feedback signal, to the Digital Predistortion Processor, and more particularly to variables 24I and 24Q. The Digital Predistortion, discussed in greater detail below, provides a digital output signal $V_r$ to a DAC 30, which converts the digital signal to an analog form, where it is combined with the modulated RF signal in the multiplier 11.

As shown in FIG. 1, address data formers 32I-32Q receive inputs from the ADC 21 I/Q, and are designed to generate the required signal format for a lookup table 33 I/Q. The data formers 32 I/Q address memory units within the lookup tables 33 I/Q, where the lookup table provides separate I and Q outputs to an adder 31. It will be appreciated that the lookup table 33 can be implemented as one or more lookup tables. The address provided by the address formers 32I-32Q can be considered a lookup-table key or address.

The predistortion controller lookup tables 33I-33Q are designed memory units to store the predistortion signal for high power amplifier linearization. The predistortion signals in the tables are based on the error generated by a comparison of the ideal signal $v_d$ and the feedback signal $v_r$ and the presented adaptive algorithm. The data stored in the tables 33 I/Q can be updated by adaptive iteration as described hereinafter, and forms digitally indexed data reflecting the nonlinear characteristics of the power amplifier.

By comparison of AM-AM and AM-PM information between the idealized signal $V_{RF}(t)$ and the feedback signal $V_o(t)$, the Digital Predistortion Processor calculates the error in the amplitude and phase components of the output signal $V_o(t)$ caused by the non-linear transmission characteristics of the high power amplifier 12.

Based on the error information obtained by the foregoing comparison, the predistortion processor, based on the lookup table algorithm disclosed in U.S. Pat. No. 6,985,704, calculates and generates adaptively a compensation signal that is of inverse characteristics with the transform function of the PA 12 to pre-distort the AM-AM and AM-PM distortion caused by the PA 12.

The outputs $v_p$ of the predistortion lookup table 33I-33Q are fed to multiplier 11, after an adder 31 and a digit-to-analog converter 30, to modify the modulated RF signal from modulator 10. The output of the multiplier is the required predistortion signal $V_{in}(k)$ that is of an inverse non-linearity with that of the power amplifier 12 to yield a pre-compensation to the input of high power amplifier.

It will be appreciated by those skilled in the art that there can be a signal difference between two signals, ideal signal $V_{RF}$ and feedback signal, $V_o(t)$, when they arrive at the predistortion controller. The time difference results from the time-delay differences between the two signals, which is caused by the different paths each travels in arriving at the controller. This signal time-delay can vary randomly based on the parameters of the circuits and parts, as well as other environmental factors. The result is that it is difficult to estimate, calculate and adjust for such signal differences in the field application environment. To overcome this issue, the present invention adaptively adjusts for this time-delay through the use of an algorithm taught by the previously cited U.S. Pat. No. 6,985,704.

The use of the look-up tables 33 permits a memory function to be introduced into at least some embodiments of the present invention. The lookup table of the predistortion controller is based on a stored compensation principle that maps a set of input data into a digital output, and updated adaptively. Based on the stored function, each output signal of lookup table is actually related to both the current and the previously transmitted signal, and therefore has a memory function which compensate not only for the non-linearity of the PA, but also avoids the need for a special time-delay compensation circuit such as typically used in the prior art.

Based on the predistortion architecture shown in FIG. 1, the non-linearity of power amplifier is corrected by the output signal $v_p$ of predistortion processor. The signal $v_p$ is multiplied with the modulated RF signal to generate the predistorted signal as the input of power amplifier. Actually, the input signal of power amplifier is a complex gain signal that can be controllable in the amplitude/envelope and be adjustable in phase. The relation of the input and output can be described as the following complex gain expression $$v_{in} = v_{RF} v_p = v_{RF} F \quad (1)$$

where $v_p$ is the output of predistortion processor generated by a mapping function F of lookup table. Usually, the mapping function F is unknown and is difficult to express mathematically. However, F may be determined adaptively by updating the entries in the lookup table in accordance with the adaptive algorithm to realize all possible mapping that corresponds to the relations with $$\{0,1\}^N v_p.$$

The lookup table therefore maps each set of N-bit input address vector V to a real output $v_p$. In fact, the N-dimensional address vector represents the transmitted signal sequences going through power amplifier from the current time though previous N time, expressed by $$V(k) = (d_1(k), d_2(k), \ldots, d_N(k))^T \quad (2)$$

where each data $d_i$ in above vector V is either 1 or 0, expressed as $$d_i(k) = 0 \text{ or } 1 \text{ for } 1 \leq i \leq N \quad (3)$$

Figure 2:
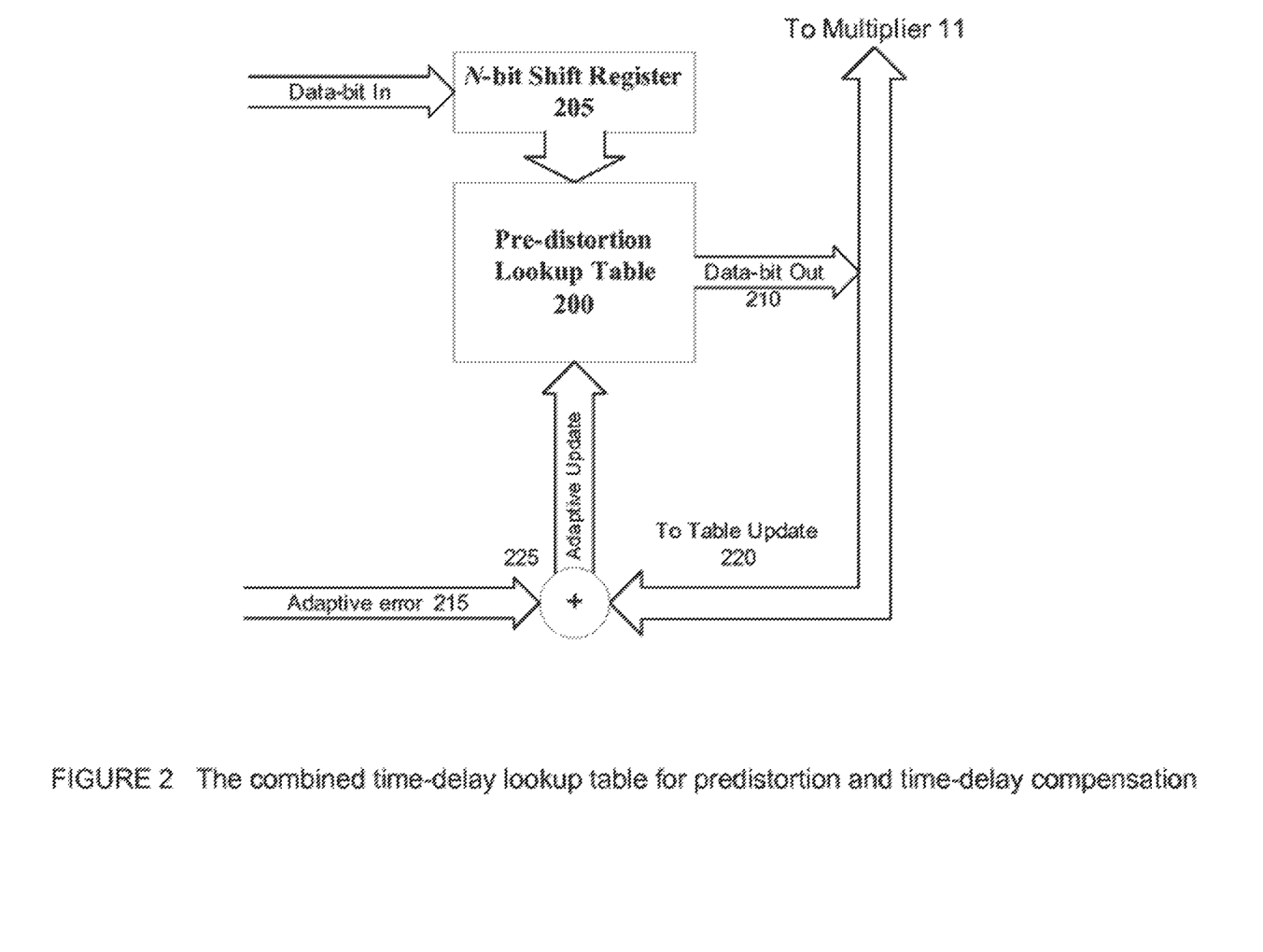
FIG. 2 illustrates in simplified form one implementation for serial addressing of the lookup table as well as the entry of the accumulated history into the lookup table.

In one implementation, shown in FIG. 2, the address of the lookup table 200 is formed by a serial shift register 205 that addresses each corresponding entry of the lookup table during the predistortion processes. Due to the addressed information being related to the current and previous N transmitted signal, the output signal 210 of the lookup table can be considered as a function of the last N transmitted data, and therefore incorporates a time delay correction element. The lookup table is adaptively updated by combining the adaptive error 215 and a table update 220 in combiner 225. The arrangement of the lookup table, configured as a predistortion processor, can systematically utilize the combined correction signal for the processing of both non-linearity correction of PA and time-delay compensation, even if time-delay effects are present when the same signal passes through different transmission paths.

The technique of using a lookup table having combined predistortion and time-delay correction makes unnecessary the use of additional time-delay processing and related circuitries. Since the address of the lookup table contains the current and previous transmitted correction information, each output signal from the lookup table is inherently a multi-time information combination that contains rich signal components from the current time to the previous N-time. As a result, the predistortion algorithm has a built-in mechanism to compensate for signal-delay effects. This results in a predistortion processing structure that is significantly simpler, and more effective than traditional solutions.

In a predistortion architecture with the lookup table as shown in FIGS. 1 and 2, the memory table is addressed by its address register. The bit-number length of shift register determines the size of lookup table and therefore the covered time-delay range, i.e., the maximum limit of time-delay effects. Each set of data stored in a lookup table entry has a unique address index. This address index of a data set corresponds to the data set's sampled time point of the input signal. The address indices are then utilized as time stamps for time calibration purpose of PA's non-linear error correction calculations. In other words, at each predistortion calculation time point, the predistortion algorithm selects only one set of data from a specific addressed entry as the output of the lookup table for further PA's non-linearity error correction processing. If the selected output signal is only related to the current-time transmitted signal without any relation with other transmitted signal, then the time-delay, caused by the current transmitted signal passing through different transmission paths, must be considered during the predistortion processing in order to provide an accurate signal matching between the reference and feedback signal.

The time-delay range to be covered by lookup table is related to the bit number of the address register. For a lookup table with an N-bit address register, the size of lookup table entries is $M=2^{N-1}$. This means that there are M entries in the lookup table, and all the data stored in the entries are the functions of address vectors that cover the current time k to previous k−M+1 time. The set of input address vectors, A, can be expressed as $$A=\{V(k),V(k-1),\ldots,V(k-M+1)\} \quad (4)$$

where $V(k)$ is an input address vector at time k, which records M possible predistorted information to PA nonlinearity and each information recoded the current transmitted signal and the time-delay signal components.

Based on the memory-compensation principle, the combined time-delay lookup table structure involves simple logic operations and signal processing to capture the time-delay of signal passing through different transmission paths. More specifically, due to the time-delay invariant characteristic, this predistortion architecture can process and correct PA non-linearities in a wider dynamic range and without the needs of additional circuitries and algorithms.

Figure 3:
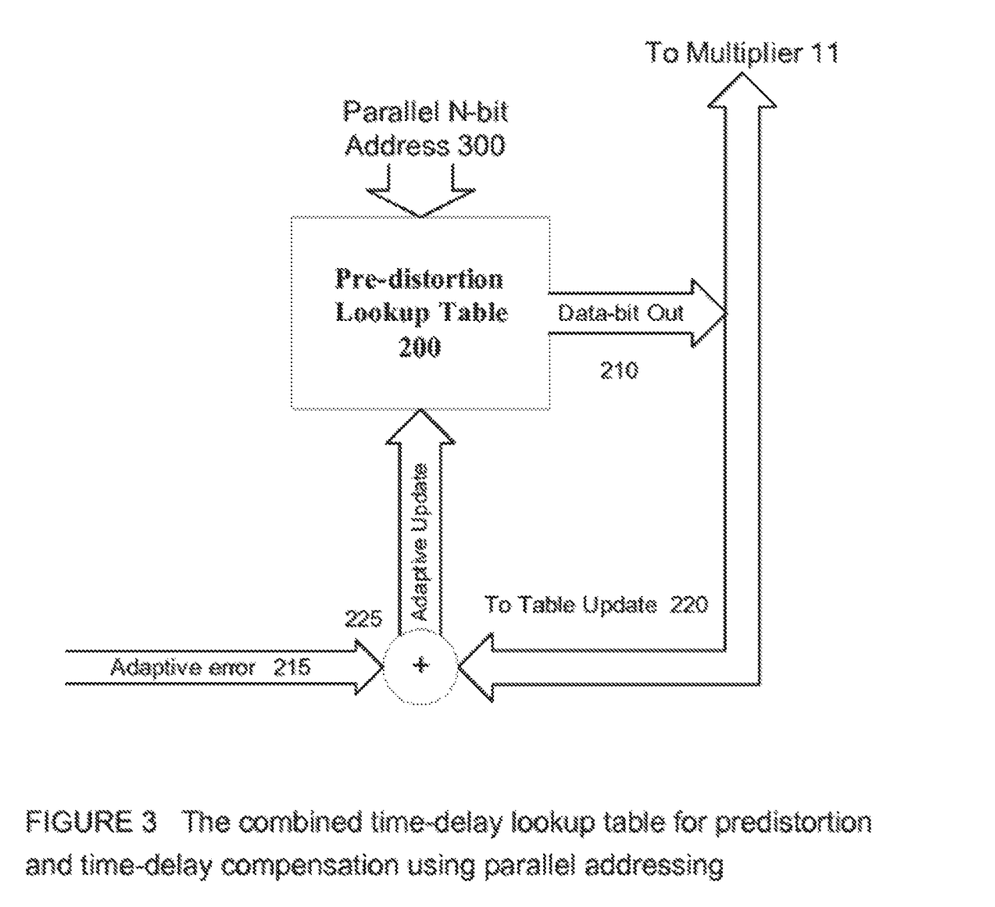
FIG. 3 illustrates in simplified form an implementation of parallel addressing of the lookup table, which is otherwise as shown in FIG. 2.

It will also be appreciated by those skilled in the art that, for some embodiments, typically those with larger lookup tables and relatively high sampling rates, a parallel addressing scheme can be used, such as that shown in FIG. 3, which is essentially identical to FIG. 2 except for the use of a parallel input 300 to the lookup table. If the sampled data points are taken close together (i.e., a comparatively fast sampling rate) so that the correction factors for sample t and sample t+1 effectively become identical, then we can use the parallel addressing approach to address the lookup table. In some embodiments, if the size of the lookup table is sufficiently large, and computing power and other device issues are satisfied, then the parallel addressing approach can offer better performance over a serial addressing approach in environments which use a very fast sampling rate.

Having fully described the invention in detail in detail, including several embodiments and alternatives, those skilled in the art will appreciate that numerous other alternatives and equivalents exist which are within the scope of the present invention. Therefore the invention is intended not to be limited by the above description, but rather only by the appended claims.

What is claimed is:

1. A predistortion system for linearizing an output of a power amplifier, the predistortion system comprising;
a first receiver that receives a first signal representative of a radio frequency (RF) modulated signal;
a second receiver that receives a feedback signal representative of at least one nonlinear characteristic of a power amplifiers;
a predistortion controller that is communicatively coupled to the first receiver via a reference path, is communicatively coupled to the second receiver via a feedback path, and generates, based on at least one time-delay correction element, a correction factor to correct the at least one nonlinear characteristic of the power amplifier,
wherein the predistortion controller includes at least one lookup table that is pre-populated with the at least one time-delay correction element that compensates for a time delay between the reference path and the feedback path.

2. The predistortion system of claim 1, wherein:
the time-delay correction element is associated with a set of inputs, and
the set of inputs includes a first difference between:
a square of a quadrature component of the first signal, and
a square of a quadrature component of the feedback signal.

3. The predistortion system of claim 2, wherein the set of inputs includes a second difference between:
a square of an in-phase component of the first signal, and
a square of an in-phase component of the feedback signal.

4. The predistortion system of claim 1, wherein the predistortion controller adaptively updates at least one correction value included in the at least one lookup table by combining a non-linear correction value of the power amplifier with the time-delay correction element.

5. The predistortion system of claim 1, further comprising a processor that combines the RF modulated signal with a second signal corresponding to the correction factor to generate a combined RF modulated signal.

6. The predistortion system of claim 5, wherein the processor supplies the combined RF modulated signal with the feedback signal to the power amplifier to linearize the output of the power amplifier.

7. The predistortion system of claim 1, further comprising combining logic that combines the RF modulated signal with a second signal corresponding to the correction factor to generate a combined RF modulated signal.

8. The predistortion system of claim 7, wherein the combining logic supplies the combined RF modulated signal and the feedback signal to the power amplifier to linearize the output of the power amplifier.

9. The predistortion system of claim 7, wherein the second signal is an analog signal.

10. The predistortion system of claim 1, further comprising a serial shift register that forms addresses for the at least one lookup table.

11. The predistortion system of claim 1, wherein the at least one lookup table is addressed by parallel signals.

12. The predistortion system of claim 1, wherein the feedback signal is an analog signal.

13. The predistortion system of claim 12, further comprising a digital-to-analog (D/A) converter.

14. The predistortion system of claim 13, wherein the D/A converter is configured to convert a digital signal corresponding to the correction factor included a second signal.

15. The predistortion system of claim 1, wherein the at least one time-delay correction element falls within a range determined by a predetermined size of the at least one lookup table.

16. The predistortion system of claim 1 wherein the at least one lookup table is configured to respond to inputs derived from outputs of the at least one lookup table.

\* \* \* \* \*